US009633846B2

(12) United States Patent
Paterson et al.

(10) Patent No.: US 9,633,846 B2
(45) Date of Patent: Apr. 25, 2017

(54) INTERNAL PLASMA GRID APPLICATIONS FOR SEMICONDUCTOR FABRICATION

(71) Applicant: Lam Research Corporation, Fremont, CA (US)

(72) Inventors: Alex Paterson, San Jose, CA (US); Do Young Kim, Albany, CA (US); Gowri Kamarthy, Pleasanton, CA (US); Helene Del Puppo, Fremont, CA (US); Jen-Kan Yu, Fremont, CA (US); Monica Titus, Sunnyvale, CA (US); Radhika Mani, Fremont, CA (US); Noel Yui Sun, Sunnyvale, CA (US); Nicolas Gani, Fremont, CA (US); Yoshie Kimura, Castro Valley, CA (US); Ting-Ying Chung, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/954,586

(22) Filed: Nov. 30, 2015

(65) Prior Publication Data

US 2016/0086795 A1    Mar. 24, 2016

Related U.S. Application Data

(60) Division of application No. 14/184,491, filed on Feb. 19, 2014, now Pat. No. 9,230,819, which is a
(Continued)

(51) Int. Cl.
*H01L 21/00* (2006.01)
*H01L 21/027* (2006.01)
(Continued)

(52) U.S. Cl.
CPC ........ *H01L 21/0273* (2013.01); *H01J 37/321* (2013.01); *H01J 37/32422* (2013.01);
(Continued)

(58) Field of Classification Search
CPC ........... H01L 21/3065; H01L 29/66795; H01L 21/28123; H01L 21/32137; H01L 21/0273; H01L 27/32422; H01L 37/321
See application file for complete search history.

(56) References Cited

U.S. PATENT DOCUMENTS

| 4,600,464 A | 7/1986 | Desilets et al. |
| 6,007,673 A | 12/1999 | Kugo et al. |

(Continued)

FOREIGN PATENT DOCUMENTS

| CN | 1716530 A | 1/2006 |
| CN | 102405512 A | 4/2012 |

(Continued)

OTHER PUBLICATIONS

U.S. Patent Application entitled "Dual Chamber Plasma Etcher With Ion Accelerator," Guha, U.S. Appl. No. 14/832,538, filed Aug. 21, 2015.

(Continued)

*Primary Examiner* — Kimberly Rizkallah
*Assistant Examiner* — Alexander Belousov
(74) *Attorney, Agent, or Firm* — Weaver Austin Villeneuve & Sampson LLP

(57) ABSTRACT

The embodiments disclosed herein pertain to improved methods and apparatus for etching a semiconductor substrate. A plasma grid assembly is positioned in a reaction chamber to divide the chamber into upper and lower subchambers. The plasma grid assembly may include one or more plasma grids having slots of a particular aspect ratio, which allow certain species to pass through from the upper
(Continued)

sub-chamber to the lower sub-chamber. In some cases, an electron-ion plasma is generated in the upper sub-chamber. Electrons that make it through the grid to the lower sub-chamber are cooled as they pass through. In some cases, this results in an ion-ion plasma in the lower sub-chamber. The ion-ion plasma may be used to advantage in a variety of etching processes.

23 Claims, 20 Drawing Sheets

Related U.S. Application Data continuation-in-part of application No. 14/082,009, filed on Nov. 15, 2013.

(60) Provisional application No. 61/809,246, filed on Apr. 5, 2013.

(51) Int. Cl.
| | | |
|---|---|---|
| *H01L 21/3065* | (2006.01) | |
| *H01L 21/3213* | (2006.01) | |
| *H01J 37/32* | (2006.01) | |
| *H01L 21/28* | (2006.01) | |
| *H01L 29/66* | (2006.01) | |
| *H01L 21/311* | (2006.01) | |
| *H01L 21/762* | (2006.01) | |

(52) U.S. Cl.
CPC .... *H01L 21/28123* (2013.01); *H01L 21/3065* (2013.01); *H01L 21/31138* (2013.01); *H01L 21/32137* (2013.01); *H01L 29/66795* (2013.01); *H01L 21/76224* (2013.01)

(56) References Cited

U.S. PATENT DOCUMENTS

| | | |
|---|---|---|
| 6,013,580 A | 1/2000 | Yanagida |
| 6,101,970 A | 8/2000 | Koshimizu |
| 6,162,323 A | 12/2000 | Koshimizu |
| 6,352,049 B1 | 3/2002 | Yin et al. |
| 6,689,283 B2 | 2/2004 | Hattori et al. |
| 6,851,384 B2 | 2/2005 | Yuda et al. |
| 6,861,643 B2 | 3/2005 | Ichiki et al. |
| 7,244,474 B2 | 7/2007 | Hanawa et al. |
| 7,291,360 B2 | 11/2007 | Hanawa et al. |
| 7,520,999 B2 | 4/2009 | Chandrachood et al. |
| RE40,951 E | 11/2009 | Kodaira et al. |
| 7,695,590 B2 | 4/2010 | Hanawa et al. |
| 7,767,561 B2 | 8/2010 | Hanawa et al. |
| 7,909,961 B2 | 3/2011 | Kumar et al. |
| 8,058,156 B2 | 11/2011 | Hanawa et al. |
| 8,349,128 B2 | 1/2013 | Todorow et al. |
| 8,356,575 B2 | 1/2013 | Sasaki et al. |
| 9,017,526 B2 | 4/2015 | Singh et al. |
| 9,039,911 B2 | 5/2015 | Hudson et al. |
| 9,147,581 B2 | 9/2015 | Guha |
| 9,230,819 B2 | 1/2016 | Paterson et al. |
| 9,245,761 B2 | 1/2016 | Singh et al. |
| 9,257,295 B2 | 2/2016 | Singh et al. |
| 2002/0179248 A1 | 12/2002 | Kabansky |
| 2003/0227258 A1 | 12/2003 | Strang et al. |
| 2004/0014325 A1 | 1/2004 | Laermer et al. |
| 2004/0221958 A1 | 11/2004 | Loewenhardt et al. |
| 2005/0025791 A1 | 2/2005 | Remenar et al. |
| 2005/0211171 A1 | 9/2005 | Hanawa et al. |
| 2005/0211546 A1 | 9/2005 | Hanawa et al. |
| 2005/0211547 A1 | 9/2005 | Hanawa et al. |
| 2005/0287811 A1 | 12/2005 | Inukai |
| 2006/0000805 A1 | 1/2006 | Todorow et al. |
| 2006/0021701 A1 | 2/2006 | Tobe et al. |
| 2006/0102286 A1 | 5/2006 | Kim |
| 2007/0000611 A1 | 1/2007 | Shannon et al. |
| 2007/0017898 A1 | 1/2007 | Kumar et al. |
| 2007/0068624 A1 | 3/2007 | Jeon et al. |
| 2007/0247073 A1 | 10/2007 | Paterson et al. |
| 2008/0060759 A1 | 3/2008 | Chen et al. |
| 2008/0099439 A1 | 5/2008 | Chang et al. |
| 2008/0178805 A1 | 7/2008 | Paterson et al. |
| 2008/0280429 A1 | 11/2008 | Mathew et al. |
| 2010/0000964 A1* | 1/2010 | Chen ................ B81C 1/00619 216/13 |
| 2010/0273332 A1 | 10/2010 | Edelberg |
| 2011/0151673 A1 | 6/2011 | Noda et al. |
| 2011/0177694 A1 | 7/2011 | Chen et al. |
| 2012/0021355 A1* | 1/2012 | Kim .................... G03F 7/095 430/273.1 |
| 2012/0031559 A1 | 2/2012 | Dhindsa et al. |
| 2012/0034786 A1 | 2/2012 | Dhindsa et al. |
| 2012/0104274 A1 | 5/2012 | Hirayanagi et al. |
| 2012/0273130 A1 | 11/2012 | Drewery et al. |
| 2012/0322011 A1 | 12/2012 | Wu et al. |
| 2012/0322270 A1 | 12/2012 | Long et al. |
| 2013/0059448 A1 | 3/2013 | Marakhtanov et al. |
| 2013/0168352 A1 | 7/2013 | Fischer |
| 2014/0054269 A1 | 2/2014 | Hudson et al. |
| 2014/0251790 A1 | 9/2014 | Kodaira et al. |
| 2014/0302678 A1 | 10/2014 | Paterson et al. |
| 2014/0302680 A1 | 10/2014 | Singh et al. |
| 2014/0302681 A1 | 10/2014 | Paterson et al. |
| 2015/0011093 A1 | 1/2015 | Singh et al. |
| 2015/0017810 A1 | 1/2015 | Guha |
| 2015/0083582 A1 | 3/2015 | Dhindsa et al. |
| 2015/0179465 A1 | 6/2015 | Singh et al. |
| 2015/0206775 A1 | 7/2015 | Hudson et al. |
| 2015/0364339 A1 | 12/2015 | Guha |
| 2015/0364349 A1 | 12/2015 | Guha |
| 2016/0141188 A1 | 5/2016 | Singh et al. |
| 2016/0181130 A1 | 6/2016 | Singh et al. |

FOREIGN PATENT DOCUMENTS

| | | |
|---|---|---|
| CN | 102834905 A | 12/2012 |
| CN | 202633210 U | 12/2012 |
| CN | 103140915 A | 6/2013 |
| JP | S6260146 A | 3/1987 |
| JP | H04137727 A | 5/1992 |
| JP | H04341744 A | 11/1992 |
| JP | H07235397 A | 9/1995 |
| JP | 2604684 B2 | 4/1997 |
| JP | 2643457 B2 | 5/1997 |
| JP | H1041276 A | 2/1998 |
| JP | 2012531520 A | 12/2012 |
| TW | 200841775 A | 10/2008 |

OTHER PUBLICATIONS

U.S. Patent Application entitled "Dual Chamber Plasma Etcher With Ion Accelerator," Guha, U.S. Appl. No. 14/832,539, filed Aug. 21, 2015.
US Office Action, dated Jan. 14, 2015, issued in U.S. Appl. No. 13/916,318.
US Office Action, dated May 8, 2015, issued in U.S. Appl. No. 13/916,318.
US Notice of Allowance, dated Oct. 7, 2015, issued in U.S. Appl. No. 13/916,318.
US Office Action, dated Feb. 10, 2015, issued in U.S. Appl. No. 13/939,709.
US Notice of Allowance, dated May 21, 2015, issued in U.S. Appl. No. 13/939,709.
US Examiner's Amendment Communication, dated Jun. 26, 2015, issued in U.S. Appl. No. 13/939,709.
US Notice of Allowance, dated Jan. 16, 2015, issued in U.S. Appl. No. 13/936,930.
US Notice of Allowance, dated Oct. 2, 2015, issued in U.S. Appl. No. 14/637,260.
US Office Action, dated May 15, 2015, issued in U.S. Appl. No. 14/184,491.

(56) References Cited

OTHER PUBLICATIONS

US Notice of Allowance, dated Aug. 28, 2015, issued in U.S. Appl. No. 14/184,491.
US Office Action, dated Oct. 11, 2013, issued in U.S. Appl. No. 13/626,793.
US Final Office Action, dated Feb. 13, 2014, issued in U.S. Appl. No. 13/626,793.
US Office Action, dated Jul. 16, 2014, issued in U.S. Appl. No. 13/626,793.
US Notice of Allowance, dated Jan. 2, 2015, issued in U.S. Appl. No. 13/626,793.
US Office Action, dated Oct. 1, 2015, issued in U.S. Appl. No. 14/676,711.
US Office Action, dated May 21, 2014, issued in U.S. Appl. No. 13/227,404.
Chinese First Office Action [no translation] dated Sep. 17, 2015 issued in CN Application No. 2013-10379780.0 (no translation).
Suda et al., (2012) "Development of Cu Etching Using $O_2$ Cluster Ion Beam under Acetic Acid Gas Atmosphere", *Japanese Journal of Applied Physics*, 51:08HA02-1-08HA02-5.
Wolf, S. and R.N. Tauber, R.N. (2000) "Silicon Processing for the VLSI Era," *Lattice Press,* ISBN 0-9616721-6-1, 1:672.
Wolf, S. and R.N. Tauber, R.N. (2000) "Silicon Processing for the VLSI Era," Chapter 14, Dry Etching for ULSI Fabrication, *Lattice Press,* ISBN 0-9616721-6-1, 1:673-676.
Xiao, (2001) "Introduction to Semiconductor Manufacturing Technology", *Published by Prentice Hall,* ISBN 0-13-022404-9, Chapter 7, p. 230.
US Notice of Allowance, dated Jun. 2, 2016, issued in U.S. Appl. No. 14/832,539.
US Office Action, dated Jul. 5, 2016, issued in U.S. Appl. No. 13/339,312.
Chinese First Office Action dated Jun. 3, 2016 issued in Application No. CN 201410138060.X.
Chinese Second Office Action dated May 17, 2016 issued in CN Application No. 2013-10379780.0.
US Notice of Allowance, dated Apr. 20, 2016, issued in U.S. Appl. No. 14/676,711.
Chinese First Office Action dated Feb. 2, 2016 issued in CN Application No. 201410138510.5.
Chinese First Office Action dated Jan. 28, 2016 issued in CN Application No. 201410138310.X.
Chinese First Office Action dated Apr. 5, 2016 issued in CN Application No. 201410330530.2.
Chinese First Office Action dated Mar. 28, 2016 issued in CN Application No. 201410323125.8.
Chinese First Office Action dated Sep. 17, 2015 issued in CN Application No. 2013-10379780.0.
U.S. Patent Application entitled "Internal Plasma Grid for Semiconductor Fabrication," Singh et al., U.S. Appl. No. 14/943,483, filed Nov. 17, 2015.
U.S. Patent Application entitled "Internal Plasma Grid for Semiconductor Fabrication," Singh et al., U.S. Appl. No. 15/055,439, filed Feb. 26, 2016.
U.S. Patent Application entitled "Internal Plasma Grid for Semiconductor Fabrication," Singh et al., U.S. Appl. No. 15/055,380, filed Feb. 26, 2016.
U.S. Patent Application entitled "Ion Beam Etching System," Singh et al., U.S. Appl. No. 14/996,656, filed Jan. 15, 2016.
US Office Action, dated Mar. 10, 2016, issued in U.S. Appl. No. 14/832,539.
Chinese First Office Action dated Jan. 18, 2017 issued in Application No. CN 201410138060.X.

\* cited by examiner

INTERNAL PLASMA GRID APPLICATIONS FOR SEMICONDUCTOR FABRICATION

CROSS-REFERENCE TO RELATED APPLICATIONS

This application is a divisional of and claims priority to U.S. patent application Ser. No. 14/184,491, titled "INTERNAL PLASMA GRID APPLICATIONS FOR SEMICONDUCTOR FABRICATION IN CONTEXT OF ION-ION PLASMA PROCESSING" filed Feb. 19, 2014, which is a continuation-in-part of U.S. patent application Ser. No. 14/082,009, filed Nov. 15, 2013, titled "INTERNAL PLASMA GRID FOR SEMICONDUCTOR FABRICATION," which claims the benefit of priority to U.S. Provisional Patent Application No. 61/809,246, filed Apr. 5, 2013, titled "INTERNAL PLASMA GRID FOR SEMICONDUCTOR FABRICATION," all of which are incorporated herein by reference in their entireties for all purposes.

BACKGROUND

One operation frequently employed in the production of semiconductors is an etching operation. In an etching operation, one or more materials are partly or wholly removed from a partially fabricated integrated circuit. Plasma etching is often used, especially where the geometries involved are small, high aspect ratios are used, or precise pattern transfer is needed.

Typically, a plasma contains electrons, as well as positive and negative ions, and some radicals. The radicals, positive ions, and negative ions interact with a substrate to etch features, surfaces and materials on the substrate. In etching conducted with an inductively coupled plasma source, a chamber coil performs a function analogous to that of a primary coil in a transformer, while the plasma performs a function analogous to that of a secondary coil in the transformer.

With the move from planar to 3D transistor structures (e.g., FinFET gate structures for logic devices), plasma etching processes need to be increasingly precise and uniform in order to produce quality products. Examples of operations that benefit from precise etching include, but are not limited to, etching/removal processes used during formation of FinFETs (e.g., source drain recess etching, FinFET gate etching, and dummy polysilicon removal), shallow trench isolation processes, and photoresist reflow processes.

Among other factors, the plasma etch processes should have good selectivity, profile angle, Iso/Dense loading, and overall uniformity. It is beneficial for an etching process to have good selectivity between the material that is etched and the material that is retained. In the context of the FinFET gate structure, this means that there should be good selectivity of the gate being etched to other exposed components such as a silicon nitride mask. The profile angle is measured as the angle between a recently etched (roughly vertical) sidewall and a horizontal plane. In many applications, the ideal profile angle is 90 degrees, producing a vertical etched step or opening. Sometimes, the local on-wafer feature density can affect the etching process. For example, an area of the wafer where features are dense may etch somewhat differently (e.g., etch more quickly, more slowly, more isotropically, more anisotropically, etc.) as compared to an area of the wafer where features are more isolated. The differences which arise due to variations in feature density are referred to as Iso/Dense loading (I/D loading). It is beneficial to minimize these differences during fabrication.

In addition to meeting these and potentially other device-specific requirements, the etching process often needs to be consistently executed over the entire face of a substrate (e.g., the etch conditions and results should be uniform from the center to the edge of a semiconductor wafer).

It has been found difficult to achieve multiple objectives such as those set forth above when etching advanced structures such as FinFET gates.

SUMMARY

The embodiments disclosed herein provide methods and apparatus for fabricating semiconductor devices. In one aspect of the disclosed embodiments, a method of plasma processing is provided, including: receiving a substrate having in a reaction chamber, where the reaction chamber comprises a grid structure dividing the interior of the reaction chamber into an upper sub-chamber proximate a plasma generator and a lower sub-chamber proximate a substrate holder; flowing a plasma generating gas into the upper sub-chamber; generating a first plasma in the upper sub-chamber from the plasma generating gas, the first plasma having a first electron density, and generating a second plasma in the lower sub-chamber, wherein the second plasma is an ion-ion plasma that has a second electron density at least about 10 times lower than the first electron density; and processing the substrate with the second plasma to perform a step in one of a source drain recess etch, a FinFET gate etch, a dummy polysilicon removal, a shallow trench isolation etch, and a photoresist reflow.

In certain embodiments, the first plasma may have a first electron temperature of about 2 eV or more, and the second plasma may have a second effective electron temperature of about 1 eV or less. The second electron density may be about $5 \times 10^9$ cm$^{-3}$ or less. The ratio of negative ions:positive ions in the second plasma may be between about 0.5-1 in some embodiments.

The method may be undertaken to perform a source drain recess etch. The source drain recess etch may include: performing a first etching process to etch the substrate in a vertical direction to form vertically etched features; performing a second etching process to etch the substrate in a horizontal direction within the vertically etched features; performing an oxidation process to form an oxidized layer within the vertically etched features; and repeating the method to form source drain recesses in the vertically etched features, where the first etching process, second etching process and oxidation process are all performed in the reaction chamber having the grid structure such that the second plasma in each process is an ion-ion plasma. The first etching process may be performed with a first plasma generating gas including $Cl_2$, the second etching process may be performed with a second plasma generating gas including $NF_3$ and $Cl_2$, and the oxidation process may be performed with a third plasma generating gas comprising oxygen. The method may be repeated to form a vertically etched feature having a reentrant shape.

In other embodiments, the method may be undertaken to perform a shallow trench isolation etch. In this case, the plasma generating gas may include HBr, and the substrate may be biased to between about 300-1200 V during the etch. The plasma generating gas may flow at a rate between about 50-500 sccm. The plasma generating gas may further include $Cl_2$. In some embodiments, the etching process may involve simultaneously etching at least a first feature shape and a second feature shape, the first feature shape having an aspect ratio of about 10 or higher and the second feature shape having an aspect ratio of about 1 or lower. After etching, an etch depth of the first feature may be at least about 95% the etch depth of the second feature. Further, after etching the first feature shape may have an etching profile of at least about 88°, and the second feature shape may have an etching profile of at least about 85°.

In some other cases, the method may be undertaken to perform a photoresist reflow process. In these embodiments, the substrate received in the reaction chamber has patterned photoresist thereon. The photoresist reflow process may include: performing a first plasma process to reflow the patterned photoresist on the substrate; and performing a second plasma process to remove a portion of photoresist in a foot region on the substrate, where the first plasma process and second plasma process are both performed in the reaction chamber having the grid, and where the second plasma during the first plasma process and second plasma process are ion-ion plasmas. The plasma generation gas during the first plasma process may include H2, and the plasma generation gas during the second plasma process may include an inert gas. The inert gas may be Ar. In certain cases, a final height of the patterned photoresist after the first and second plasma processes is at least about 50% of an initial height of the patterned photoresist before the first and second plasma processes. A final line width roughness after the first and second plasma processes may be about 75% or less of an initial line width roughness before the first and second plasma processes. For example, the final line width roughness may be about 65% or less of the initial line width roughness.

In another aspect of the disclosed embodiments, a method of etching polysilicon on a partially fabricated integrated circuit to define a FinFET gate region is provided, including: receiving a substrate having a layer of polysilicon thereon in a reaction chamber, where the reaction chamber includes a grid structure dividing the interior of the reaction chamber into an upper sub-chamber proximate a plasma generator and a lower sub-chamber proximate a substrate holder; flowing a plasma generating gas into the upper sub-chamber; generating a first plasma in the upper sub-chamber from the plasma generating gas, and generating a second plasma in the lower sub-chamber, where the second plasma is an ion-ion plasma; and etching the polysilicon layer provided on the substrate to thereby define a FinFET gate region.

In some cases, etching the polysilicon layer to thereby define a FinFET gate region includes etching the polysilicon to form cavities in locations that will be proximate a FinFET gate in a completed integrated circuit. A mask layer may be positioned above the polysilicon layer, and this mask layer may reduce in thickness by less than about 10% during the etching process. A pressure in the reaction chamber during the etching may be between about 5-20 mTorr. In some cases, there is substantially no profile loading between on-fin regions and off-fin regions during etching. In various embodiments, fins proximate the etched regions do not become recessed during etching.

Etching the polysilicon layer to thereby define a FinFET gate region may include etching the polysilicon to form cavities in locations where a FinFET gate will be positioned in a completed integrated circuit. The method may be performed a first iteration with a first plasma generating gas including HBr, and a second iteration with a second plasma generating gas including Cl$_2$. Other chemistries may be used in certain cases. In various embodiments, both the first and second plasma generating gases are substantially free of oxygen-containing reactants. The pressure in the reaction chamber may be between about 20-80 mTorr during the first iteration, and between about 4-80 mTorr during the second iteration. There may be substantially no etching profile loading between etched features positioned at different feature densities.

In various embodiments, an effective electron temperature in the second plasma may be about 1 eV or less, and an is less than an effective electron temperature in the first plasma. Further, an electron density in the second plasma may be about $5\times10^9$ cm-3 or less, and be less than an electron density in the first plasma. In certain embodiments, the grid structure may include two or more grids, at least one of which is movable relative to the others.

These and other features will be described below with reference to the associated drawings.

DETAILED DESCRIPTION

Figure 1:
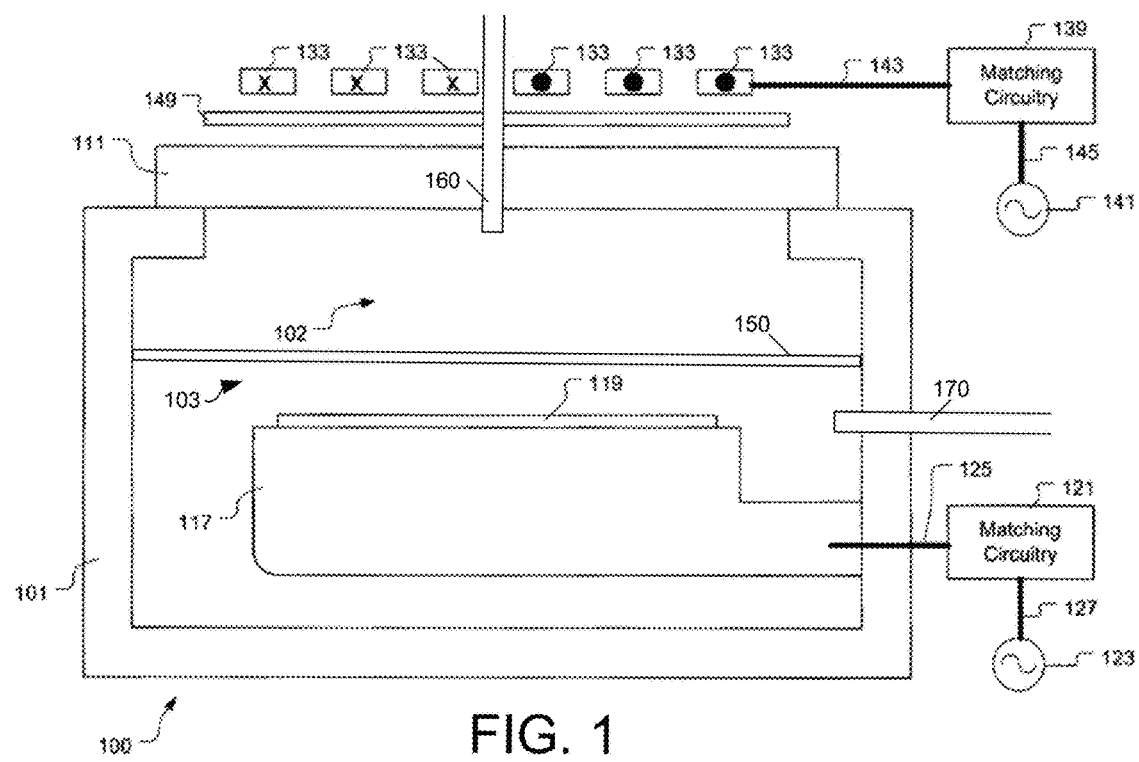
FIG. 1 is a schematic cross-sectional diagram illustrating a plasma processing system utilized for etching operations in accordance with certain embodiments disclosed herein.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to devices on a semiconductor wafer during any of various stages of integrated circuit fabrication thereon. The following detailed description assumes the invention is implemented on a wafer. However, the invention is not so limited. The work piece may be of various shapes, sizes, and materials.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Disclosed is an apparatus used in etching semiconductor substrates and layers formed thereon during the manufacture of semiconductor devices. The apparatus is defined by a chamber in which etching is performed. In certain embodiments, the chamber includes a planar window, a generally planar excitation coil, and a pedestal or chuck for holding the semiconductor substrate during etching. Of course, this disclosure is not limited to any particular type of plasma source. In addition to planar excitation coils, dome and plate plasma sources may be employed. Sources include inductively coupled plasma sources, capacitively coupled plasma sources, and others known to those of skill in the art. The embodiments herein utilize a grid positioned within the chamber that separates the chamber into two sub-chambers. In various embodiments, a collection of two or more stacked grids, sometimes referred to as a "grid assembly" is used. During operation, each sub-chamber contains a plasma having distinct properties. Plasma is primarily or exclusively generated in the upper sub-chamber, and certain species are able to pass unaffected through the grid or grid assembly into the lower sub-chamber. The grid has slots, which penetrate the thickness of the grid. In certain implementations, these slots extend roughly radially outward. As used herein, "extending roughly radially outwards" means that the feature being discussed has at least some radially directed component. In other words, the entire feature need not be overall radially directed, so long as there is some part of the feature that extends in a generally center-to-edge direction. Further, the "center-to-edge direction" is defined to include a range of angles around the true center-to-edge direction (e.g., within about 20° of the true center-to-edge direction).

The grid or grid assembly may contain multiple radial slots that penetrate the thickness of the grid. The grid and slots are designed such that only a fraction of high energy electrons in the upper sub-chamber may pass through the grid. Collectively, the higher energy electrons generally become lower energy "colder" electrons upon passing through the grid and entering the lower sub-chamber. While high energy electrons may have sufficient energy to pass through the grid, many of them approach the grid at an angle at which they collide with the grid and lose energy. The high energy electrons that do make it through the grid do not have enough energy collectively to sustain the plasma underneath grid because they are now isolated from the excitation source. The mechanisms for the hot electrons to become cold in the lower chamber include collision with the grid, collisions with neutral species under the grid and shielding of the electrons under the grid from the excitation source above the grid. Thus, the grid may produce a plasma in the lower sub-chamber having a low electron density ($n_e$) and low average effective electron temperature ($T_e$). Above the grid or grid assembly, the plasma is typically a conventional electron-ion plasma, in which a very large fraction of the negatively charged species are electrons. Below the grid or grid assembly, the plasma contains a much higher percentage of negative ions and in fact may be an ion-ion plasma. Certain characteristics of an ion-ion plasma are described below. Generally, as compared to the electron-ion plasma, the ion-ion plasma contains a significantly higher proportion of negatively charged species that are ions (rather than electrons).

Position of the Grid within the Reactor

The grid or grid assembly is positioned inside the plasma chamber, thereby separating the chamber into an upper sub-chamber and a lower sub-chamber. An example of a chamber suitable for modification to include a grid as described herein is a Kiyo Reactor from Lam Research Corporation of Fremont, Calif. For context, the following description may be considered with reference to FIG. 1, which is further described below. In certain implementations, the grid is positioned between about 1-6 inches above the interior base of the reaction chamber, or between about 1-6 inches (e.g., between about 1.5-3 inches) above a substrate supporter such as a pedestal. In these or other implementations, the grid may be positioned between about 1-6 inches (e.g., between about 1.5-3 inches) below the interior ceiling of the reaction chamber. The ceiling is often outfitted with a dielectric window.

In certain embodiments, the heights of the upper and lower sub-chambers are substantially the same (e.g., within about 5%), while in other embodiments these heights may differ more considerably. The ratio of the height of the upper chamber to the height of the lower chamber ($h_u/h_l$), also referred to as the sub-chamber height ratio, may be between about 0.1-10, or between about 0.2-5. In some embodiments, the sub-chamber height ratio is greater than about ⅙.

The grid should not be positioned too close to the wafer, as this may cause printing of the grid to occur on the wafer's face. In other words, the pattern of slots in the grid may undesirably appear on the face of the wafer after processing, causing severe etch non-uniformity on the substrate surface. For many applications, a separation distance of at least about 1 inch from the top of the substrate to the grid is sufficient.

The Grid Design

Various designs may be used to implement the grid. In some embodiments, the grid is a fairly simple thin sheet of material having slots, generally circular holes, or other perforations allowing some electrons to pass from the upper sub-chamber to the lower sub-chamber. In other embodiments, the grid may consist of a more complex grid assembly having multiple components. For example, the grid assembly may have multiple grids, support elements and/or movement causing elements.

In a simple implementation, the grid is a relatively thin sheet having slots. Additionally, in some embodiments, the grid may include holes. Thus, the grid includes holes and slots in combination. Non-limiting examples of grid structures are shown in FIGS. 2A, 2B and 3A-3D. The material contained in the grid may be an insulator, conductor, or some combination thereof. In certain implementations, the grid contains one or more materials including, but not limited to, metals, metallic alloys such as stainless steel, aluminum, titanium, ceramic, silicon, silicon carbide, silicon nitride, and a combination thereof. The material may or may not be anodized or otherwise passivated for, e.g., corrosion resistance. In one embodiment, the grid is made from a metallic material having a ceramic coating. Other coatings may also be used. The use of a coated grid is especially beneficial where the layers being etched are volatile. In certain implementations, a grid may be coated with a pure coating including, but not limited to, coatings of $Y_2O_3$, $YF_3$, YAG, titanium nitride, or $CeO_2$, for example. Further, the grid may be grounded, floating or biased. In some implementations, a grounded grid acts as an enhanced bias current return for the cathode.

The grid generally spans an entire horizontal cross-section of the chamber. Where the chamber is circular (as viewed from above), the grid will also be circular. This allows the grid to effectively divide the reaction chamber into two sub-chambers. In certain designs, the circular shape of the grid is defined by to the geometry of the substrate, which is typically a circular wafer. As is well known, wafers typically are provided in various sizes, such as 200 mm, 300 mm, 450 mm, etc. Other shapes are possible for square or other polygonal substrates or smaller substrates, depending on the etching operations performed within chamber. Thus, the cross-section of the grid may have a variety of shapes and sizes. A flat planar grid cross-section is appropriate for some embodiments. However, dished, domed, oscillating (e.g., sinusoidal, square wave, chevron shapes), slanted, etc. grid cross-sections are appropriate in other embodiments. The slots or holes through any of these cross-sectional profiles will have characteristics (including aspect ratios as described elsewhere herein).

The grid may on average be between about 1-50 mm thick, preferably between about 5-20 mm thick. If the grid is too thick, it may not function correctly (e.g., it may block too many species from getting through, have too much mass, take up too much space in the reaction chamber, etc.). If the grid is too thin, it may not be able to withstand the plasma processing, and may need to be replaced fairly often. Typically, the thickness of the grid is also limited by the desired aspect ratio of the slots in the grid, as the height of the slots is determined by the grid thickness, as described below.

In some embodiments, the grid functions as a separator between an upstream and a downstream plasma, where the downstream plasma exists in the lower sub-chamber and may be radical rich. In this manner, a plasma chamber outfitted with a grid may produce a result similar to that accomplished with existing remote plasma tools such as the GAMMA™ platform tools available from Novellus Systems, now Lam Research Corporation of Fremont, Calif. When operated for this purpose, the grid may be relatively thick, e.g., about 20-50 mm thick.

In certain embodiments, the grid includes slots that have a long, thin shape. The slots extend radially outwards from the center of the grid. The slots have a height, width and length (the width and length are explicitly labeled in FIG. 2A). The slot height is measured along an axis perpendicular to the face of the grid (i.e., the slot height is oriented vertically in most operating configurations), and this height is generally equal to the thickness of the grid. The width of the slots may be variable or constant over the radial extent of the slots. In certain cases, the slots may be pie-shaped (i.e., thinner towards the center and thicker towards the edge of the grid). In various embodiments, the slots extend length-wise outwards from the center of the grid (i.e., radially). In some embodiments, the slot widths are no greater than about 25 mm. The length of the slots may be variable or constant around the azimuthal extent of the grid. The angular separation of the radial slots may be variable or constant around the grid.

If no slots were present in the grid, a current would be induced in the grid during plasma generation. This current would flow substantially circularly around the grid or would form local eddy currents, and would result in increased power consumption. However, the presence of the slots prevents such parasitic current from forming, thereby saving power and resulting in a more efficient process. Openings having shapes such as substantially circular holes are less effective in preventing this current from forming. However, as mentioned, circular openings may be used in conjunction with slotted openings.

The aspect ratio of a slot is defined as the ratio of the slot's height to its width (h/w). Typically, the geometry of this aspect ratio will be viewable as a cross-section taken perpendicular to the lengthwise direction of the slot (often radial). Because the width of the slots may be variable, the aspect ratio may be similarly variable. In certain embodiments, the slots' aspect ratio (which may be variable or constant throughout the grid) is between about 0.01-5, or between about 0.3-5, or between about 1-4, or between about 0.5-2. In many embodiments, grids having these aspect ratios reduce the electron density and effective electron temperature in the lower sub-chamber, as compared to the upper sub-chamber. As mentioned, it is believed that the effective electron temperature is reduced as electrons pass through the slots at least in part because a number of hot electrons are colliding with the grid. Further, the effective electron temperature in the lower sub-chamber is reduced compared to the upper sub-chamber because the electrons in the lower sub-chamber are shielded by the grid and therefore are not subject to inductive heating from the plasma coils (or other plasma source).

When holes are employed together with slots, the holes may serve the same purposes as the slots. Therefore they will generally have aspect ratios as set forth above. In some embodiments, the holes have a diameter in the range of about 0.05 inches to about 0.2 inches. They penetrate the full thickness of the grid.

An additional benefit provided by the grid is that it may neutralize convective flow effects from the main injector. This allows for a more uniform gas flow onto the face of the wafer. The presence of a grid or grid assembly between the wafer and the gas injector(s) in the upper chamber can significantly reduce the convective impact of any gas delivered out of the gas injector(s) because the grid will disrupt the gas flow and result in a more diffusive flow regime over the wafer.

In some embodiments, the grid contains gas delivery holes. In such embodiments, the grid may serve the additional purpose of being a showerhead for the upper and/or lower sub-chambers. In these embodiments, one or more channels may be included in one or more grids. These channels may be fed with gas from an inlet (or multiple inlets), and deliver the gas to a plurality of outlet holes in the grid(s). The outlet holes may form gas distribution showerheads that deliver process gasses to either or both of the upper and lower sub-chambers.

In some implementations, the grid has a region such as a central region containing a feature for allowing a probing apparatus to be disposed through the grid. The probing apparatus can be provided to probe process parameters associated with the plasma processing system during operation. Probing processes can include optical emission endpoint detection, interferometeric endpoint detection, plasma density measurements, ion density measurements, and other metric probing operations. In certain embodiments, the central region of the grid is open. In other embodiments, the central region of the grid contains an optically clear material (e.g., quartz, sapphire, etc.) to allow light to be transmitted through the grid.

In certain embodiments, it may be preferable to have a slot in the grid about every 15 mm to 40 mm near the outer edge of the grid for a 300 mm wafer etcher. This corresponds to azimuthally adjacent slots being separated by about 18°, or about 48°, respectively. As such, in certain embodiments, azimuthally adjacent slots are separated by at least about 10°, or at least about 15°. In these or other embodiments, azimuthally adjacent slots are separated by no more than about 40°, or no more than about 50°, or no more than about 60°.

In some embodiments, the plasma grid may include cooling channels embedded in the grid, and these cooling channels may be filled with a flowing or non-flowing coolant material. In certain embodiments, the cooling material is a fluid such as helium or other inert gas or a liquid such as DI water, process cooling water, fluoroinert, or a refrigerant such as perfluorocarbons, hydrofluorocarbons, ammonia and CO2. In these or other embodiments, the plasma grid may include embedded heating elements and/or a temperature measurement device. The cooling channels and embedded heaters allow for precise temperature control, which permit close control over the particle and wall conditions. This control may be used to tune the conditions in the lower zone plasma, in certain cases. For example, where the plasma grid is maintained at a cooler temperature, etch byproducts from the wafer will preferentially deposit on the grid, thereby reducing the gas phase density of the etch byproducts in the lower sub-chamber. Alternatively, the grid or grid assembly may be maintained hot (e.g., above 80° C.) to reduce the deposition on the grid and ensure that the chamber can remain relatively clean and/or reduce the time required to clean the chamber during waferless auto clean (WAC).

Another feature which may be included in certain embodiments is that the grid may act as a showerhead for delivering process gases to either or both of the upper and lower sub-chambers. As such, the grid may contain a plurality of channels which connect a gas supply source with the upper and/or lower sub-chambers. The showerhead holes may be arranged to provide uniform gas delivery into the sub-chambers.

Further, in certain embodiments, more than one gas supply source is used. For example, different process gases may be delivered to the upper and lower sub-chambers (either through one or more showerhead-type grids or by other gas delivery means). In a particular implementation, an inert gas is delivered to the upper sub-chamber, and plasma etching chemistry is delivered to the lower sub-chamber. In some other embodiments, the gas delivered to the upper sub-chamber is $H_2$, $N_2$, $O_2$, $NF_3$, or $C_4F_8$ or another fluorocarbon, though the embodiments are not so limited. In these or other implementations, the gas delivered to the lower sub-chamber may be $N_2$, $CO_2$, or $CF_4$ or another fluorocarbon, though again, the embodiments are not so limited.

It is sometimes useful to have a plasma processing reactor allowing a wide range of plasma conditions adjacent to the work substrate. Such conditions include the plasma density, the effective electron temperature in the plasma, and the ratio of electrons to ions in the plasma. For in situ processing, where multiple layers are being processed in a chamber, it may be necessary to change the processing conditions for each layer. A fixed position grid may limit the operating window of the reactor, e.g. high plasma density may not be achievable if the grid is optimized for producing an ion-ion plasma in the lower sub-chamber. Therefore, certain embodiments provide grids and grid assemblies in which grid line of sight open area is tunable by rotation and/or translation.

In certain embodiments, the plasma grid can be raised or lowered with respect to the plasma coils or other plasma source. This may be accomplished by mounting the grid on a movable stage, for example. In some implementations, the vertical movement allows an operator or controller to change the effective electron temperature, the electron or plasma density, the ratio of electrons to ions, the concentration of radicals, etc. in the upper and lower zone plasmas. Further, because the concentration of radicals is affected by the height of the plasma grid, the use of a movable plasma grid allows for a process where the concentration of radicals is tunable throughout a multi-stage process. As radical species are chemically reactive and negative ions have different etch properties than electrons, this parameter is especially useful to tune/control to achieve a desired reaction.

Figure 3A:
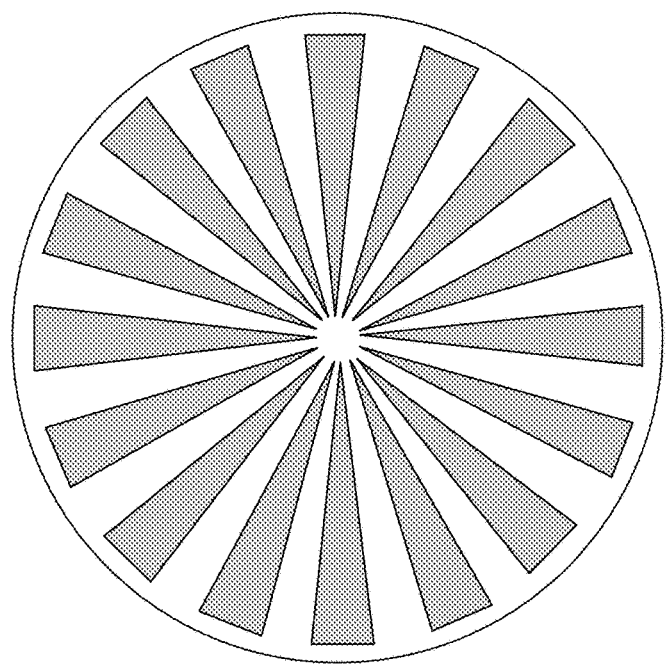
FIGS. 3A and 3B illustrate a pair of plasma grids that may be used to radially tune plasma conditions in the lower sub-chamber.
Figure 3B:
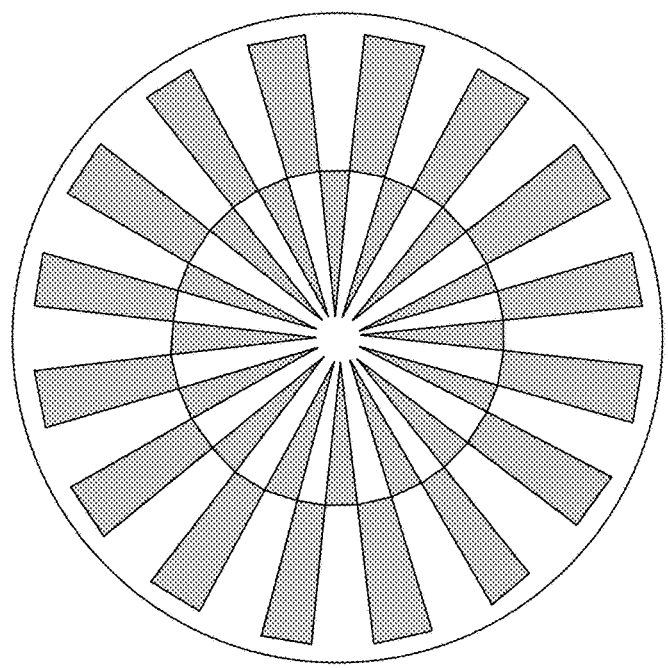

Furthermore, in some implementations multiple plasma grids may be used in a single grid assembly in the reaction chamber. Where multiple grids are used, the number of grids is typically between about 2 and 5. Often, where multiple plasma grids are used, at least one of the plasma grids is movable with respect to at least one other plasma grid. Generally, the movement is accomplished either by rotating or separating the grids (in some cases both types of movement are used). The use of a rotatable grid in a grid assembly allows the grid open area to be easily varied both between different processes/wafers, and within a single process/wafer over the course of processing the wafer. Importantly, the effective electron temperature and electron density in the lower sub-chamber will be a function of the grid open area.

Where multiple grids are used, it is helpful to define certain additional parameters. An assembly slot or other opening is an area of the assembly, as viewed from above, where an opening in one grid is aligned with an opening in the other grid(s), thus creating a clear line of sight through the plasma grid assembly, as shown in FIG. 3E. Where the slots/holes in the grids do not align, there is no clear line-of-sight through the grid assembly, as shown in FIG. 3F. With regard to FIGS. 3E and 3F, upper grid 302 is positioned above lower grid 304. The dark areas below each of the grids 302 and 304 are open areas through which species may travel. In a specific embodiment, the dark area below lower grid 304 is an upper portion of the lower sub-chamber.

Multiple assembly opening are typically present in a single plasma grid assembly. The geometry of the assembly opening varies as the individual grids move with respect to one another. For example, the width of an assembly slot may vary as a first grid rotates with respect to a second grid. Similarly, the aspect ratio of the assembly slots, defined as total distance between the top of the top grid and bottom of the bottom grid divided by the line of sight open width, may vary as the grids rotate or otherwise move with respect to one another. In some embodiments, the aspect ratio of the assembly slots may range between about 0.1-5.

The grid assembly open area is defined as the total area of the slots on the grid assembly where the slots are aligned (as viewed from a plane parallel to the face of the grid). Where the slots are misaligned, as shown in FIG. 3F, certain species in the plasma (especially charged species such as ions and electrons) substantially do not pass through to the lower sub-chamber. This misaligned arrangement of slots effectively increases the aspect ratio of the slots in the assembly, or eliminates the assembly slots altogether where there is no slot overlap, reducing the fraction of hot electrons passing from the upper sub-chamber to the lower sub-chamber. Where the slots are aligned as in FIG. 3E, however, plasma species can pass through the slots as described above. In one example, two identical plasma grids are used, each having about 50% open (slotted) area. In this example, the grid assembly open area may vary between 0% (when the individual plasma grids are completely misaligned) and about 50% (when the individual plasma grids are exactly aligned). In another example, each plasma grid has an open area of about 75%. In this case, the grid assembly open area may vary between about 50-75%. By changing the grid assembly open area, the plasma conditions in the lower sub-chamber may be tuned. For example, when the grid assembly open area is larger, the effective electron temperature in the lower zone plasma is higher, the electron density in the lower zone plasma is higher, the ratio of electrons to ions in the lower zone plasma is higher, and the concentration of radicals in the lower zone plasma is lower, as compared to when the grid assembly open area is smaller.

The use of multiple grids is particularly beneficial because it provides a wide process window of plasma densities and other plasma conditions over the wafer in a single processing station. This benefit is especially helpful when processing complicated structures having multiple layers and/or multiple types of exposed materials. As mentioned, it is often necessary to change the processing conditions for each layer processed.

The slot pattern on each plasma grid may be the same or different from the other plasma grid slot pattern. Further, the slot patterns may be designed to provide open area over particular areas of the wafer. For example, the slots may be designed such that there is more open area near the center of the wafer compared to the edge of the wafer (or vice versa). Further, the slots may be designed such that the grid assembly open area is concentrated on different parts of the wafer at different times during the process. For example, the slots may be designed such that the grid assembly open area is concentrated near the center of the wafer towards the beginning of the process, and near the edge of the wafer towards the end of the process (or vice versa). This rotation allows the gas flow, plasma density, plasma type (e.g., ion-ion plasma), and effective electron temperature, to name a few parameters, to be tuned radially over the wafer over the course of the process. This tunability may be beneficial in producing uniform etch results over the entire face of the wafer, and may be particularly helpful in addressing center-to-edge non-uniformities that otherwise arise during processing. An example of a pair of electron grids that may be used in a plasma grid assembly to achieve these radial tuning effects is shown in FIGS. 3A and 3B. In these figures, the slots (open area) are shown in gray and the grid material is shown in white.

The use of separable grids allows certain distances to be controlled and tuned. For example, distances that might be tuned include the distance between the wafer and the lower grid, the distance between the top of the upper sub-chamber and the upper grid, and/or the distance between the grids. These variable distances allow a wider range of electron temperature and plasma density tuning above the wafer compared to a single fixed grid.

Certain implementations utilize a plasma grid assembly having both movable and fixed plasma grids. The grids may be grounded or electrically floating, and may be supported by support legs or other feature connected to a movement causing element such as a rotational actuator or lifter. In some embodiments, the movement causing element is positioned below the wafer and wafer support pedestal, though other placements may be used. The support legs may be conductive or insulating, depending on whether the grid being supported is grounded or electrically floating.

Figure 4:
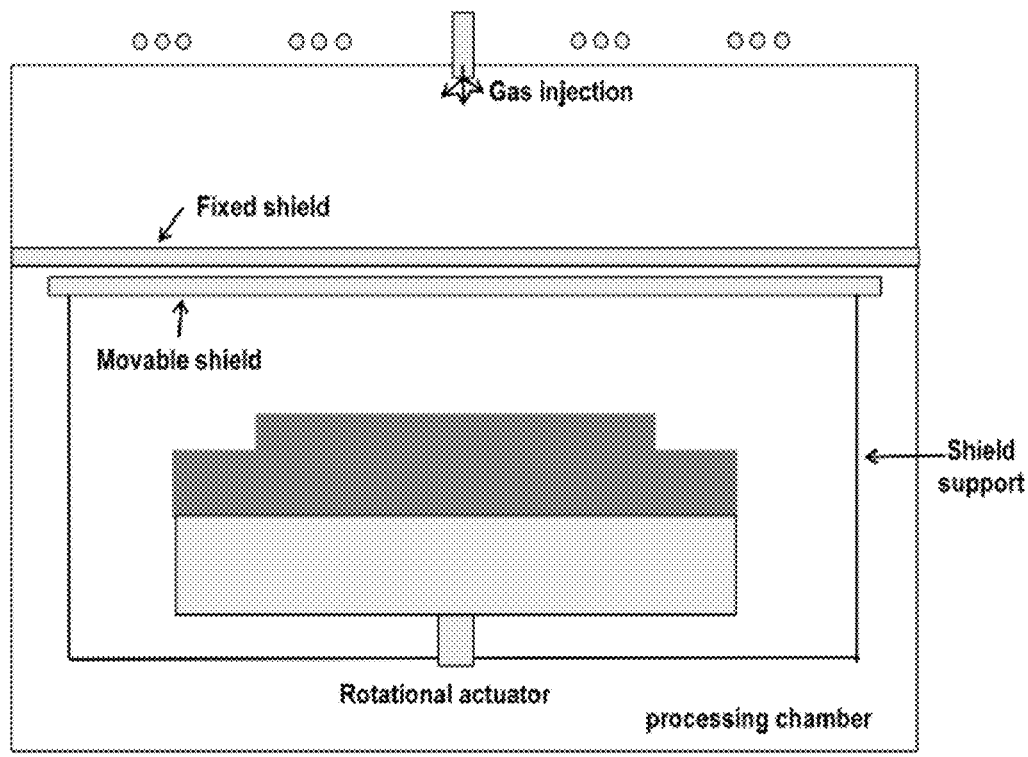
FIG. 4 illustrates a simplified representation of a processing chamber having a fixed plasma grid positioned over a movable plasma grid in accordance with an embodiment herein.
Figure 5:
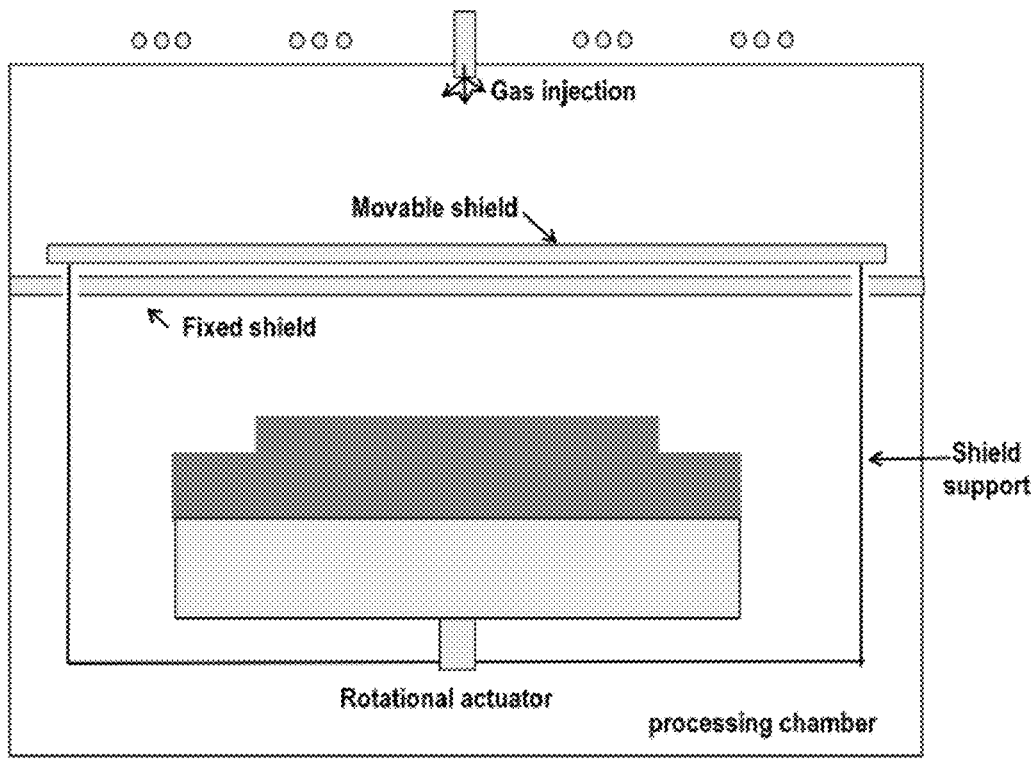
FIG. 5 shows a simplified representation of a processing chamber having a movable plasma grid over a fixed plasma grid in accordance with an embodiment herein.

It is generally beneficial for the fixed grid to be grounded. When the fixed grid is positioned above the movable grid, as shown in FIG. 4, the grounded connection of the fixed grid provides a good ground path for any RF current flowing to the grid from the upper chamber excitation source. This may be especially useful where the upper chamber is excited by an ICP source and is less than about 5 cm in height, or where the upper-zone plasma is generated using a VHF CCP source. When the fixed grid is positioned below the movable grid, as shown in FIG. 5, the grounded connection provides a large ground return surface for the bias current in the lower-zone plasma. This may be especially desirable where large bias voltages (e.g., greater than about 100 V) are required on the wafer during the etch process.

The optimal electrical connection of the movable grid may depend on the relative position of the fixed and movable grids. Where the fixed grid is positioned above the movable grid, it may be beneficial for the movable grid to be electrically floating. In contrast, where the fixed grid is positioned under the movable grid, the movable grid may be either grounded or floating. Where the movable grid is grounded, the support structure should be conductive (e.g., metallic). Where the movable grid is electrically floating, the support structure should be insulating.

When the fixed grid is positioned below the movable grid, the fixed grid may have arc shaped slots (or other slots allowing for arc-like movement across the slots) to allow the movable grid supports to extend through the fixed grid in order to connect the supports with the movement causing element. As noted above, this implementation is shown in FIG. 5. Alternatively, the movable grid may be supported by movable support structures extending inwards from the periphery of the reaction chamber, or it may be supported by a structure that connects with the top of the reaction chamber. Whatever implementation is used, the support structure should be designed such that it does not interfere with the formation of the upper and lower zone plasmas as desired. Further, it is desirable to keep the actuators for moving the grids well below the wafer plane such that there is minimal risk of particle transport from the actuators to the wafer.

The grid assembly can be biased using DC or RF sources. If the grid assembly has multiple conductive grids, it is desirable to bias them together to the same potential. Alternatively, the grid assembly may consist of only one conductive grid and one or more floating/insulating grids where only the conductive grid is biased.

Multi-component grid assemblies are further discussed and described in U.S. patent application Ser. No. 13/916,318, filed Jun. 12, 2013, and titled "INTERNAL PLASMA GRID FOR SEMICONDUCTOR FABRICATION," which is herein incorporated by reference in its entirety.

Plasma Properties

The grid effectively divides the chamber plasma two zones: an upper zone proximate the coils for generating the plasma and a lower zone proximate the substrate holder. In various embodiments, the plasma in the upper zone contains relatively "hot", high-energy electrons. Often, this plasma is characterized as an electron-ion plasma. In various embodiments, the plasma in the lower zone contains relatively "cold", low-energy electrons. Often, this lower zone plasma is characterized as an ion-ion plasma.

Plasma may be generated primarily or exclusively in the upper sub-chamber. In one embodiment, an inductively coupled plasma is generated in the upper sub-chamber by running current through coils located above the upper sub-chamber. A single coil or multiple coils may be employed. In other embodiments, a capacitively coupled plasma is generated using, for example, a VHF CCP source. The plasma in the upper sub-chamber will have distinctly different characteristics from the plasma in the lower sub-chamber due to the presence of the grid.

In many embodiments, the upper zone plasma is a conventional electron-ion plasma. In this type of plasma, most of the positively charged species are positive ions and most of the negatively charged species are electrons. Although negative ions exist, they are present only in relatively low concentrations. In contrast, the plasma in the lower sub-chamber is an ion-rich plasma, often an ion-ion plasma. As compared to the electron-ion plasma, the ion-ion plasma has a greater proportion of negatively charged species that are negative ions, and a lower proportion of negatively charged species that are electrons. In certain implementations, the ratio of the concentration of positive ions to the concentration of electrons (sometimes referred to as the positive ion to electron ratio, $n_i/n_e$) in the ion-ion plasma is about 2 or greater, and in some cases is about 5 or greater, or even about 10 or greater. In certain cases, the positive ion to electron ratio is at least about 2 times greater (e.g., at least 5 times greater) in the lower plasma than in the upper plasma.

A related difference between the two plasmas is that the upper zone plasma has a significantly higher electron density. For example, the electron density in the lower zone plasma may be about $5 \times 10^9$ cm$^{-3}$ or less (e.g., about $1 \times 10^9$ cm$^{-3}$ or less). These ranges are particularly applicable to electron negative processing gases. The upper zone plasma may have an electron density that is at least about 10 times greater (e.g., at least about 100 times greater, or at least about 1000 times greater) than that of the lower zone plasma. In some cases, the lower sub-chamber has an ion-ion plasma where electron density is at least an order of magnitude smaller than the negative ion density and positive ion density. In a particular example, Ne~$10^8$ cm$^{-3}$, Ni+~$10^9$ cm$^{-3}$, Ni−~$10^9$ cm$^{-3}$.

An additional difference between the upper and lower zone plasmas, which is somewhat implicit based on the electron:ion ratios, is that the lower zone plasma will typically have a higher ratio of negative ions to positive ions. Because the upper zone electron-ion plasma typically contains primarily positive ions and electrons, with relatively few negative ions, the negative ion:positive ion ratio will be low. The negative ion:positive ion ratio in the lower zone plasma may be between about 0.5-1 (e.g., between about 0.8-0.95).

One non-limiting explanation for relatively low concentration of electrons in the lower zone plasma is that the electrons initially present in the lower zone (e.g., the electrons passing from the upper zone to the lower zone through the grid) are generally not heated by RF fields and quickly lose energy due to inelastic collisions with gas molecules, resulting in low effective electron temperature. These low energy electrons are more likely (as compared to the high energy electrons in the upper zone plasma) to interact with a neutral species to produce negative ions. Electrons must have a relatively low energy to attach to neutrals and form negative ions. This negative ion production will not occur with high energy electrons, which may "kick off" another electron when colliding with the neutral species instead of combining to form a negative ion.

As indicated, the effective electron temperature is greater in the upper zone plasma as compared to the lower zone plasma. Electrons may be cooled as they pass through the slots in the grid. Typically, the effective electron temperature in the lower zone plasma is about 1 eV or less. In certain cases, the effective electron temperature in the lower zone plasma may be between about 0.1-1 eV (e.g., between about 0.2-0.9 eV). The effective electron temperature may be at least about two times greater (e.g., at least about three times greater) in the upper zone plasma than in the lower zone plasma, as measured in electron volts. In a particular implementation, the upper zone plasma has an effective electron temperature of about 2.5 eV and the lower zone plasma has an effective electron temperature of about 0.8 eV. In various embodiments, this difference in the effective electron temperature arises wholly or partially from the presence of the grid.

Without being limited to any specific theory or mechanism, the role of the grid may be explained as follows. The grid may partially shield the lower sub-chamber such that the charged species therein are not directly exposed to power from the plasma coils. Additionally, the particular aspect ratios of the slots in the grid cause a fraction of the high energy electrons to collide with the grid when passing through the slots. This produces two qualitatively different plasmas in the two plasma zones.

Another distinguishing characteristic of the upper and lower zone plasmas is their plasma potentials. The plasma potential in the upper chamber is generally higher than in the lower chamber. For example, the plasma potential in the upper plasma may be between about 8-35 V (e.g., between about 10-20 V), while the plasma potential in the lower plasma may be between about 0.4-10 V (e.g., between about 0.5-3 V). This is because the electron energy has dropped and so the plasma does not need to be as positive to prevent electrons from leaving it.

Further, the two plasmas will typically have different energy distribution functions (e.g., ion energy distribution function and electron energy distribution function). Both the electron and ion energy distribution functions will be narrower in the lower plasma and broader in the upper plasma. By using the grid, it is possible to achieve a very narrow ion energy distribution function without using sophisticated control with a waveform generator. For example, the ion energy distribution function for the lower plasma might have a full width half maximum of only about 5 V. As a consequence, negative current can be drawn from negative ions, which arrive at the substrate surface to maintain electroneutrality (instead of electrons serving this purpose). This provides a unique etching mechanism.

The radical concentration in the lower zone plasma may range between about 1% of total neutral density to about 70% of the total neutral density, or about 10% to about 70% of the total neutral density or about 10% to about 50% of the total neutral density.

The chamber pressure during the etch operation may be below about 2000 mTorr, such as between about 1-2000 mTorr (e.g., between about 2-200 mTorr). In one particular example, the chamber pressure is maintained at or below about 20 mTorr. These pressures are particularly useful when employed with a lower zone plasma having an effective electron temperature of about 0.5 eV or lower and/or an electron density of about $5 \times 10^8$ cm$^{-3}$ or lower. These pressures are also particularly useful when employed with a lower zone ion-ion plasma.

As mentioned, in certain embodiments the plasma is a transformer coupled plasma. One or more TCP coils may be used to generate the plasma. In some instances, the plasma is generated by an inner TCP coil and an outer TCP coil that each distributes RF power through the reaction chamber's dielectric window. The inner and outer TCP coils may be substantially coplanar, with the outer coil surrounding the inner coil. The inner and outer coils may each be used to conduct a current for sustaining a portion of the plasma. A parallel circuit may be used to adjust the amperage of the current through each of the inner and outer coils. In other words, the power delivered to the inner and outer coils may be tuned. The parallel circuit may be electrically coupled between a power source and the coils, and may include an inductor and a variable capacitor electrically connected in parallel to each other. The ratio of power delivered to the inner coil to power delivered to the outer coil is referred to as transformer coupled capacitive tuning (TCCT). A TCCT of 0.75, for example, means that the power delivered to the inner coil is only about 75% of the value of power delivered to the outer coil. In certain embodiments, TCCT may be between about 0.25-1.5, for example between about 0.25-0.75, or between about 0.5-1.5, though these examples are not limiting. Transformer coupled capacitive tuning is further discussed and described in U.S. patent application Ser. No. 12/728,112, filed Mar. 19, 2010, and titled "ADJUSTING CURRENT RATIOS IN INDUCTIVELY COUPLED PLASMA PROCESSING SYSTEMS," which is herein incorporated by reference in its entirety.

Ion-ion plasmas are believed to provide certain benefits for semiconductor processing. For example, partially fabricated semiconductor devices etched in an ion-ion plasma show very good selectivity, profile angle, I/D loading, and overall uniformity across the face of the substrate being etched. Previous techniques could not achieve all of these benefits (i.e., process designers had to choose between, for example, achieving good overall etch uniformity and the other benefits). Thus, the embodiments herein represent a significant advancement in etching methodology.

Figure 6A:
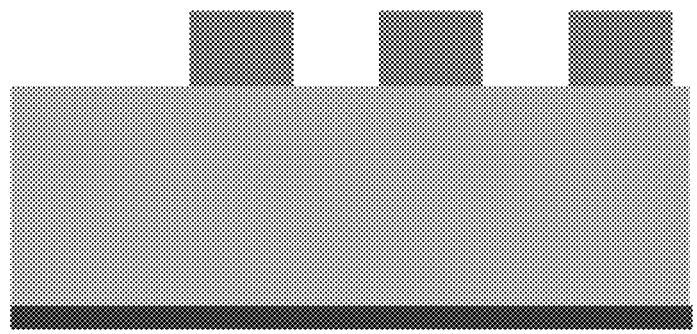
FIGS. 6A-6C illustrate certain problems that arise due to etching byproduct dissociation.
Figure 6B:
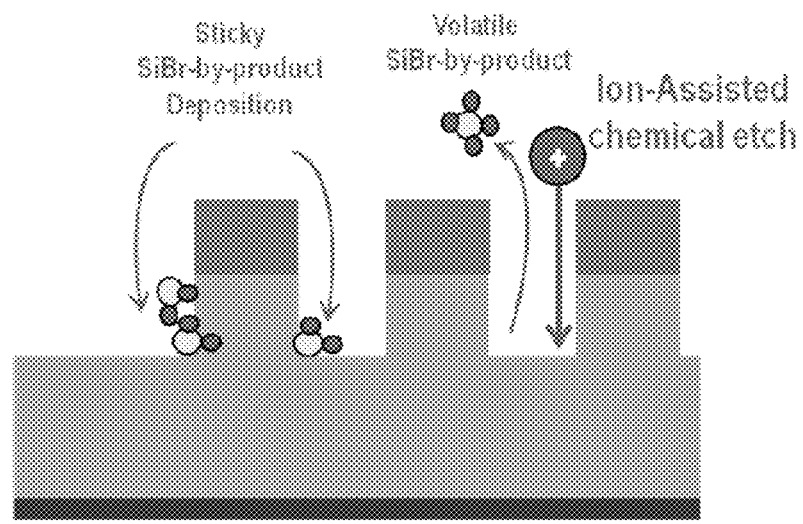
Figure 6C:
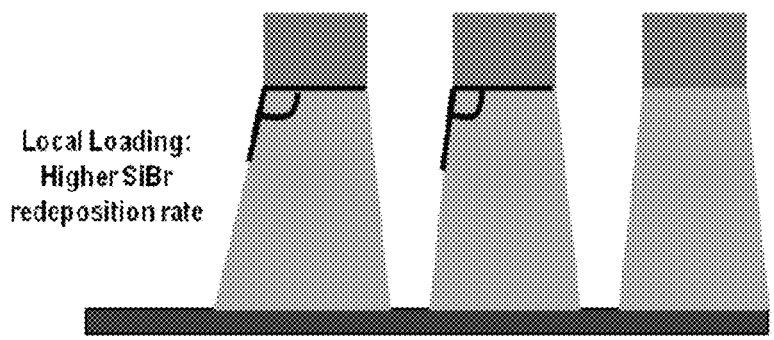

FIGS. 6A-6C illustrate the effect of the breakdown of etching byproducts on a feature being etched. To begin, FIG. 6A shows a substrate having three layers deposited thereon. The bottom layer represents a gate oxide, the middle layer represents polysilicon, and the top layer (shown as three separate blocks) represents a hard mask. It is believed that in a conventional etching process, the plasma present in the chamber acts, in part, to dissociate etching byproducts, as shown in FIG. 6B. These byproducts are often volatile components (e.g., SiBr$_4$), which under the right conditions are swept away from the substrate. However, when a high electron density plasma, which is typical of an electron-ion plasma, contacts the wafer, high energy electrons in the plasma can react with the volatile byproducts to cause them to dissociate into physico-chemically "sticky" dissociation products (e.g., SiBr$_2$). These dissociation products adhere to the substrate as shown in FIG. 6B, often to a sidewall of a feature being etched, and cause the etch process to occur in a non-vertical or otherwise undesirable manner, as shown in FIG. 6C. This dissociation product adherence/redeposition leads to local loading effects resulting in a non-vertical etch.

The use of a grid to reduce the effective electron temperature of the plasma proximate the substrate being etched reduces these undesirable effects. The production of an ion-ion plasma, with its correspondingly reduced electron density and effective electron temperature, therefore significantly reduces these undesirable effects. Because ions generally have significantly less energy than electrons, the ions in the present embodiments' ion-ion plasma do not cause this byproduct dissociation. Although the present embodiments may produce an electron-ion plasma, this high electron density/high effective electron temperature plasma may be confined to the upper sub-chamber. Therefore, etch byproducts tend to contact only the lower zone plasma, and do not come into contact with the high effective electron temperature, upper zone plasma. Further, although there will be some electrons present in the ion-ion plasma, these electrons generally have a low $T_e$ and therefore will not typically have enough energy to cause the byproduct dissociation. As such, the etch byproducts are not dissociated into "sticky" problem-causing compounds.

Wafer Biasing

In certain implementations, the wafer is biased during processing. This is accomplished by applying a bias to the electrostatic chuck used to hold/support the wafer. Because the wafer is exposed to a low $T_e$, low electron density plasma (such as an ion-ion plasma) in the lower sub-chamber, bias may be applied to the chuck in a way that captures/encourages the unique benefits of the ion-ion plasma. Further, the bias may be applied in a manner that avoids the formation of an electron-ion plasma in the lower sub-chamber. For example, the bias may have a frequency and power appropriate to prevent conversion of an ion-ion plasma to an electron-ion plasma.

In certain embodiments, the RF bias may have a frequency below 30 MHz, preferably between about 100 kHz to about 13.56 MHz, to reduce the amount of electron heating generated by the application of bias power to the substrate. In some embodiments, the bias (regardless of frequency) is pulsed in the range of about 1 Hz to about 10 kHz with a duty cycle of between about 1% and 99%.

In conventional electron-ion plasmas, the plasma potential is fairly high and positive, as described above. This plasma potential effectively limits the ability of electrons to escape the plasma. However, the lower zone plasma typically has an unconventionally low electron density and temperature and therefore requires a much lower plasma potential to effectively confine its electrons. The low plasma potential opens the operating window, optionally allowing negative ions present in the ion-ion plasma to accelerate towards and strike the wafer during the bias waveforms' positive cycle. This etching regime was previously unobtainable in continuous wave plasmas.

The frequency of the bias applied to the electrostatic chuck may be designed to optimize the formation and attraction of ions (particularly but not exclusively negative ions) in an ion-ion plasma. In this regard, the frequency of the bias applied to the electrostatic chuck is between about 0.1-15 MHz (e.g., between about 400 kHz-13.56 MHz). In a particular example, the bias is about 8 MHz. This frequency may be particularly useful, as it corresponds to the ion transport frequency. Other frequencies may also be used, but may be less effective. For example, frequencies between about 100 kHz-1 MHz may work to some extent, but may be less effective than the higher frequencies cited above.

It should be noted that where a grid is used and an AC bias of appropriate frequency is applied to the electrostatic chuck/wafer, the plasma sheath over the wafer can operate to alternatively pull negative ions and positive ions out of the plasma and accelerate them towards the face of the wafer. In other words, the plasma sheath will attract negative ions in a positive cycle and then positive ions in a negative cycle, and these cycles repeat with the AC bias. As explained above, this negative ion attraction (to the wafer) was not possible before implementation of the present embodiments because the plasma potential was too high, thereby drowning out any attractive effect from the relevant half of the AC bias cycles.

As mentioned, the bias may be applied in pulses. However, pulsing is not needed for many cases. The present embodiments achieve a stable ion-ion plasma above the wafer during the entire etching process. As such, the bias on the chuck/wafer does not need to be pulsed to achieve the benefits described herein. However, in certain embodiments, the bias may nevertheless be applied in pulses, such as to reduce the etch rate or the amount of ion bombardment of the substrate to increase the selectivity of the etch to the under-layer. Bias pulsing in ion-ion plasmas can be particularly beneficial by enhancing selectivity when alternating between ions and radicals. In other words, pulsing may partition the flux of ions and radicals to the substrate surface (pulse on: radicals+ions—pulse off: radicals only).

Process/Applications

The apparatus and plasma conditions disclosed herein may be used to etch any of a variety materials such as silicon (including polycrystalline, amorphous, single crystal, and/or microcrystalline silicon), metals (including but not limited to TiN, W, TaN, etc), oxides and nitrides (including but not limited to SiO, SiOC, SiN, SiON, etc.), organics (including but not limited to photoresists, amorphous carbon, etc), and a variety of other materials including, but not limited to, W, Pt, Ir, PtMn, PdCo, Co, CoFeB, CoFe, NiFe, W, Ag, Cu, Mo, TaSn, $Ge_2Sb_2Te_2$, InSbTe Ag—Ge—S, Cu—Te—S, IrMn, Ru. The concept can be extended to materials like $NiO_x$, $SrTiO_x$, perovskite ($CaTiO_3$), $PrCAMnO_3$, PZT ($PbZr_{1-x}Ti_xO_3$), $(SrBiTa)O_3$, and the like. The apparatus can be used with any gas combination that is available in a present day fabrication facility (including HBr, CO, $NH_3$, $CH_3OH$, and the like).

The apparatus and plasma conditions disclosed herein may be employed to etch features in devices or other structures at any technology node. In some embodiments, the etch is used during fabrication of in the 20-10 nm nodes or beyond. Etching can occur during both front end of line fabrication procedures and back end of line fabrication procedures. The etching may provide superior vertical profile, material selectivity, I/D loading, and/or wafer center to edge uniformity of better than about 2%. A few examples of suitable etch applications include shallow trench isolation, gate etch, spacer etch, source/drain recess etch, oxide recess, and hard-mask open etch.

Source Drain Recess Etch for FinFETs

One step in the formation of a FinFET is to etch a source drain recess. For various applications, it is desirable to create a reentrant shape in the source drain recess while etching. This reentrant profile may help promote a desired stress level in the channel region of the FinFET after epitaxial deposition of SiGe or SiC in the negative space created by the source drain recess etch. An etched shape is considered reentrant if there is a narrower etched portion above a wider etched portion. The source drain recess formation may be accomplished through a plasma etching process. By processing with conventional plasma etching conditions, it has been possible to create vertical and tapered etching profiles. Conventional methods also allow a round isotropic recess to be formed. However, where more complex shapes are desired for the source drain recess, conventional plasma etching techniques have been unsuccessful.

Figure 7A:
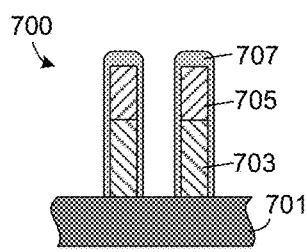
FIGS. 7A-7C together show different shapes that can be etched into a substrate during a source-drain recess etch.
Figure 7B:
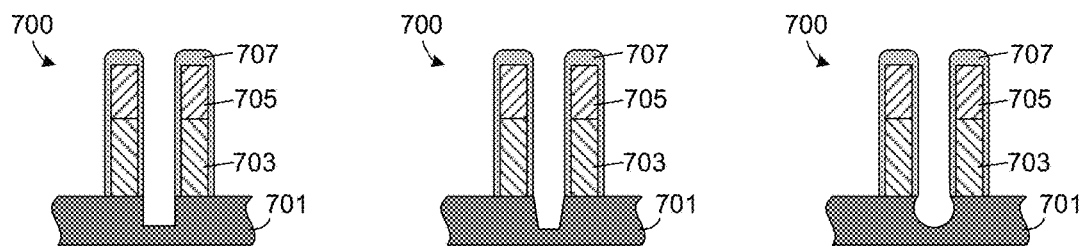
Figure 7C:
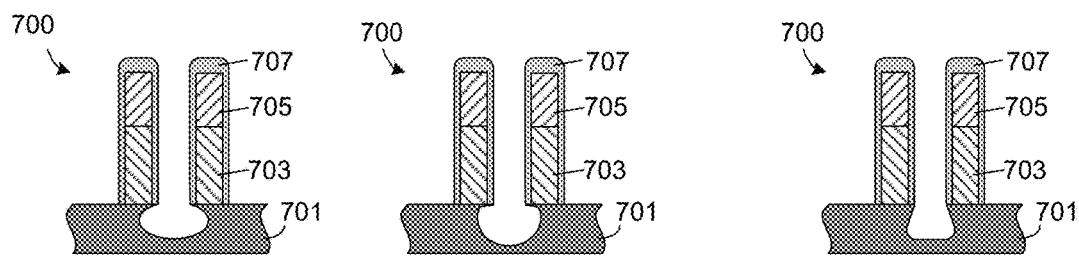

By etching under ion-ion plasma conditions, a variety of new recessed shapes can be achieved. FIG. 7A shows a partially fabricated semiconductor device gate structure post spacer deposition 700 on substrate fin structure 701 before a source drain recess etching process occurs. The device 700 includes features that help dictate the shape of fin. For instance, a mask layer 705 may be above a poly layer 703. A spacer layer 707 may surround the mask 705 and poly or a Si gate structure 703. The spacer layer 707 may protect the underlying layers 703, 705 and portions of 701 as the source drain recess is etched. FIG. 7B shows examples of recess shapes that are achievable with conventional plasma processing, and FIG. 7C shows examples of additional recess shapes that may be formed using ion-ion plasma processing. The etched shapes form the source drain recess regions, which will later filled with epitaxial SiGe, for example. Further examples of recess shapes that may be formed using the disclosed techniques are provided in FIGS. 19 and 20, which are described in the Experimental section.

Figure 8:
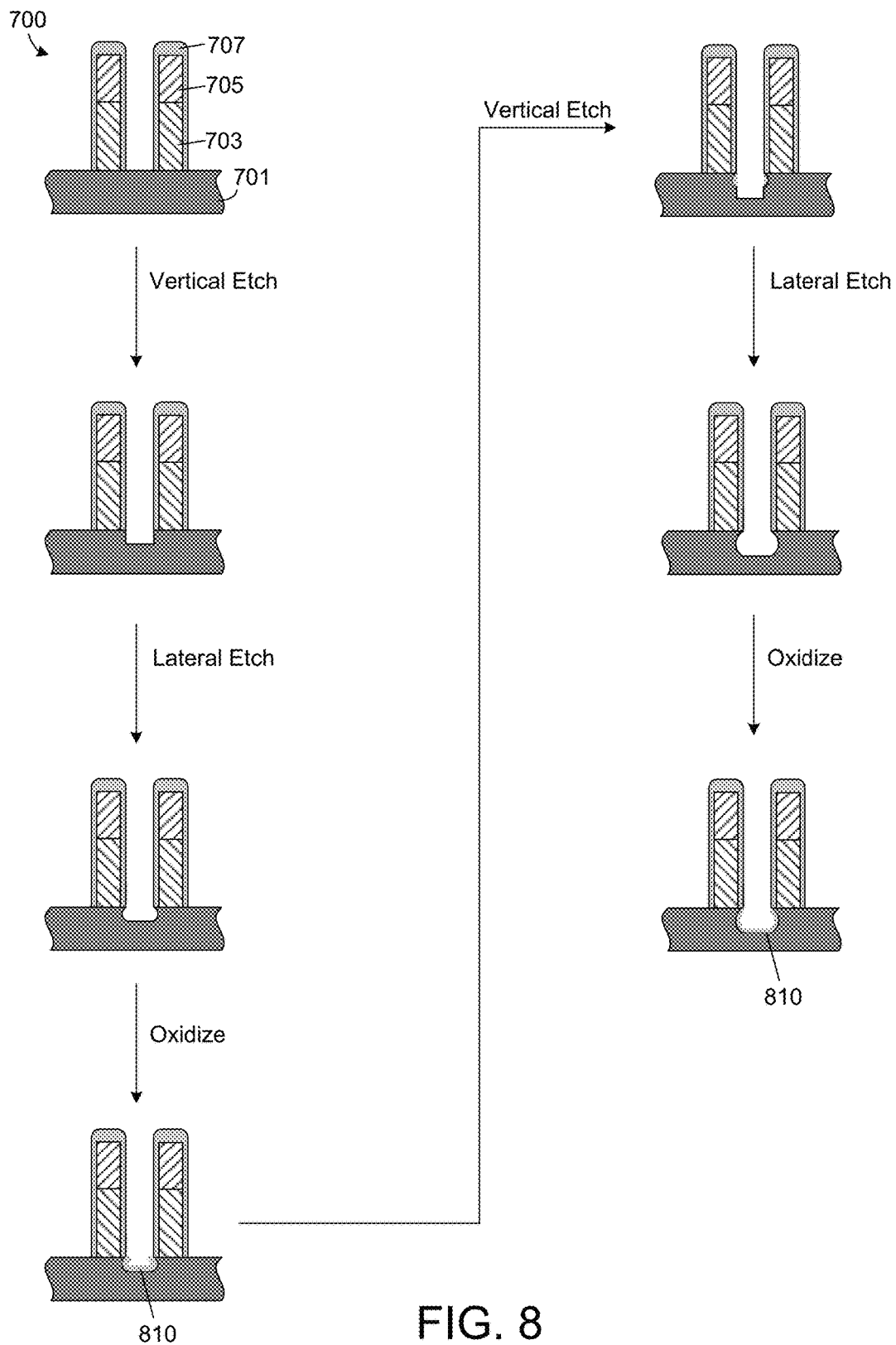
FIG. 8 illustrates a substrate as it undergoes different etching and oxidation stages in a source-drain recess etch.

One method for forming the source drain recess region is to perform a multi-step process involving (1) a vertical etch, (2) a lateral etch, and (3) an oxidation step. This process is shown in FIG. 8. One, two or all of these processes may be performed under ion-ion plasma conditions. Although only two iterations of etching and oxidation are shown, any number of iterations may be used. This multi-step process allows the recessed shape to be etched relatively slowly into the substrate 701, which is often single crystal silicon. The vertical and lateral etch steps are performed to remove material in a vertical and horizontal direction, respectively. The oxidation step is performed to form oxide layer 810, which protects the sidewalls of the etched recess from further lateral etching. Where a conventional plasma is used, this multi-step process forms a recognizable scalloped shape on the sidewalls of the recessed feature, which corresponds to the distinct oxidation and lateral etch steps. FIG. 8 shows the shape achieved where an ion-ion plasma is used, and does not show the scallops that occur with conventional plasma processing.

One factor that promotes formation of the scallops is that the conventional, relatively aggressive plasma used during the oxidation step forms a thick/hard oxide, which is very difficult to reshape with subsequent etches. The rate of oxide formation is proportional to the flux of oxygen radicals to the substrate. Conventional plasmas result in a thick/hard oxide due to the significantly higher radical density, which correlate with higher electron density and electron temperature. In comparison, with an ion-ion plasma, the electron temperature, electron density and radical density are all fairly low. Thus, processing in an ion-ion plasma regime during the oxidation step results in the formation of a thinner, more workable oxide. This thinner oxide is easier to reshape in subsequent etch steps compared to the thick oxide formed using a conventional plasma. Advantageously, the oxide formed under ion-ion plasma conditions is still sufficiently thick and high quality to adequately protect the recessed feature from over-etching. Further, the ion-ion plasma regimes are beneficial during the etch steps, as the gentle plasma conditions result in a relatively low vertical and lateral etch rates, for example due to the low ion flux to the surface.

To perform the vertical etch under ion-ion plasma conditions, plasma is generated in the upper sub-chamber from an etchant such as $Cl_2$ (or HBr, $CF_4$, $SF_6$, $CHF_3$, some combination thereof, or any other combination of gases that etches silicon). Below the grid, an ion-ion plasma forms and etches the substrate (e.g., single crystal silicon) in a vertical direction. The flow rate of etchant may be between about 1-1000 sccm. The sub-chamber pressure may be between about 10-200 mT. The chamber temperature may be between about 40-60° C. The substrate temperature may be between about 0-120° C. The power used to generate the plasma may be between about 100-1100 Watts per station. The RF frequency used to generate the plasma is 13.56 MHz. The substrate may be biased between about 0-850V. A single vertical etching process may have a duration between about 10-120 seconds. The vertical etch rate may be between about 10-120 nm/min.

To perform the lateral etch step under ion-ion plasma conditions, plasma is generated in the upper sub-chamber from an etchant such as a mixture of $NF_3$ and $Cl_2$. $SF_6$ may also be used in some cases. Below the grid, an ion-ion plasma forms and etches the substrate, this time in a direction that is primarily lateral. The total flow rate of etchant may be between about 50-500 sccm. Where a mixture of $NF_3$ and $Cl_2$ are used, the flow rate of $NF_3$ may be between about 5-50 sccm, and the flow rate of $Cl_2$ may be between about 20-300 sccm. The chamber pressure may be between about 5-100 mT. The chamber temperature may be between about 40-60° C. The substrate temperature may be between about −5 C-120° C. The power used to generate the plasma may be between about 200-1000 Watts per station (TCP). The RF frequency used to generate the plasma is 13.56 MHz. The substrate may not be biased in some embodiments. A single lateral etching process may have a duration between about 5-120 s.

To perform the oxidation step under an ion-ion plasma regime, plasma is generated in the upper sub-chamber from an oxygen-based plasma generation gas. In some cases, the plasma generation gas is $O_2$. In other cases, the source gas may additionally or alternatively include other components such as $N_2$. Below the grid, an ion-ion oxygen-based plasma forms and interacts with the substrate to form an oxidized layer in the recessed region. This oxidized layer helps prevent over-etching in subsequent etching operations. The flow rate of plasma generation gas may be between about 10-800 sccm. The chamber pressure may be between about 10-100 mT. The chamber temperature may be between about 40-60° C. The substrate temperature may be between about 0-120° C. The power used to generate the plasma may be between about 0-1500 W per station, for example between about 100-1500 W/station. The RF frequency used to generate the plasma is 13.56 MHz. The substrate may be biased between about 0-300V, for example between about 50-300 V. A single oxidation process may have a duration between about 5-60 s.

FinFET Gate Etch

The next example of an application that can benefit from processing under an ion-ion plasma regime is etching a gate structure for a FinFET. In various applications, this process may involve etching polysilicon having an overlying mask (e.g., SiN or oxide material) to form an outline of final gate structures. The polysilicon that remains after the FinFET gate etch is therefore shaped/positioned where a final gate will be. The polysilicon may be a dummy layer of polysilicon, meaning that it is a temporary material used to help define the region shape where a final gate will be positioned. In later processing steps, the polysilicon is removed and replaced with the desired final gate materials. Another way to describe the FinFET gate etch process is that the polysilicon layer is being etched to thereby define a FinFET gate region by forming cavities in locations that will be proximate a FinFET gate in a completed integrated circuit. The locations referred to are the actual cavities that are etched (not the entire polysilicon layer or locations between the etched cavities).

The FinFET polysilicon gate etch typically involves challenging performance targets, particularly for the 20-10 nm technology nodes. Examples of such performance targets include (1) a vertical polysilicon etch profile for aspect ratios greater than about 3; (2) about 0 nm or less silicon recess of the fin; (3) at least about 50 nm of mask (e.g., SiN mask) remaining after etching; (4) about 0 nm Iso/Dense loading; (5) about 0 nm center-to-edge non-uniformity across the substrate. With respect to the second performance target, as you etch down vertically, defining the gate profile, you will come across a feature called a fin. The fin runs perpendicular to the gate. The fin height is about 30 nm tall and will be encountered during the last 30 nm of the gate etch. The fin is made of silicon but has a thin oxide layer on top having a thickness of about 3-5 nm. The gate-etch process must be highly selective, otherwise it will begin to etch the fin. This is called fin recess. The gate etch process typically requires over-etch to pull in the bottom taper of the gate in order to make it vertical. It is important that the fin does not become etched during the FinFET polysilicon gate etch.

With conventional plasma processing, it has been very difficult to achieve these targets simultaneously. Previously, a three step etching process has been used for the FinFET polysilicon gate etch. These steps included (1) a low pressure main etch, (2) a high pressure soft landing etch, and (3) a high pressure over etch. These processes result in a tradeoff between gate profile, selectivity, iso/dense loading, and center-to-edge non-uniformity.

Where an ion-ion plasma is used, however, the FinFET polysilicon gate etch can be accomplished in a single etch, with substantially fewer tradeoffs between the process goals. The grid described herein effectively changes the plasma processing environment such that an ion-ion plasma is created in the lower sub-chamber. This processing environment results in different plasma-wafer surface interactions than are experienced when processing in conventional plasma. Specifically, the radical rich, ion-ion plasma environment opens the available process window to a lower pressure regime (e.g., 5-20 mTorr) that was previously limited by poor selectivity between polysilicon and oxide, and severe iso/dense loading. Previously, the high pressure etching regimes (e.g., >80 mTorr) were necessary in order to achieve the desired mask selectivity and etching profile, but also resulted in relatively high center-to-edge non-uniformity. In contrast, by processing in an ion-ion plasma regime, all of the goals listed above can be achieved with a single step etch. Specifically, the ion-ion plasma regime results in an etching process having infinite polysilicon:oxide selectivity (etching the polysilicon while not etching the oxide at all), a vertical etching gate profile, no or substantially no center-to-edge non-uniformity, and no or substantially no iso/dense loading.

Figure 9:
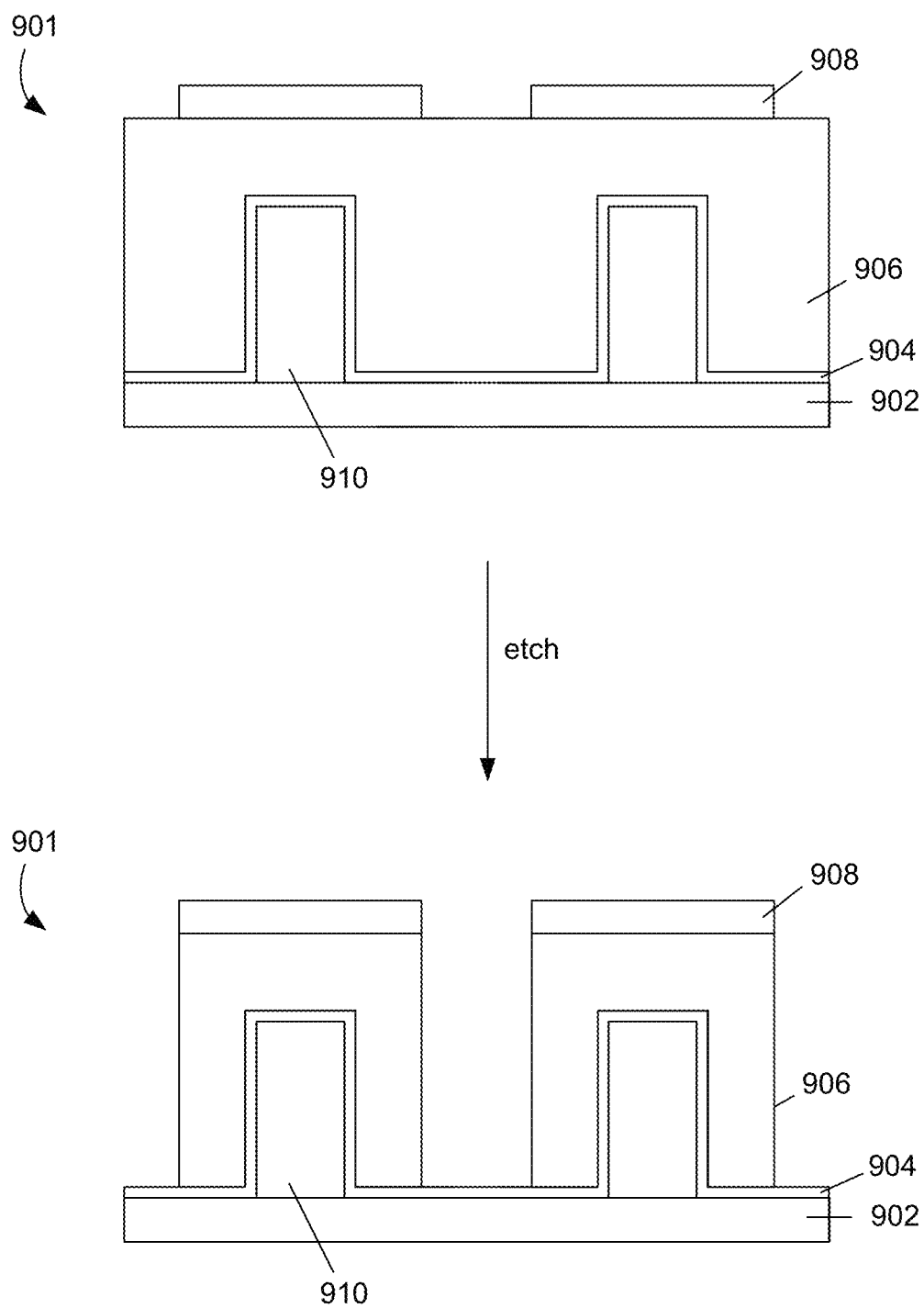
FIG. 9 shows a partially fabricated semiconductor device as it undergoes a FinFET polysilicon gate etch.

FIG. 9 illustrates a partially fabricated semiconductor device 901 as it undergoes a FinFET polysilicon gate etch. The device 901 includes fin 910 on silicon substrate 902, which are both covered by a thin protective oxide layer 904. The protective oxide 904 may be $SiO_2$, for example. Above the protective oxide 904 is a layer of polysilicon 906. This polysilicon layer 906 is the layer that is etched during the FinFET polysilicon gate etch. Above the polysilicon layer 906 is a layer of patterned mask 908, which may be silicon nitride, an oxide, or an oxide with a layer of silicon nitride in various cases. During the etching process, plasma is generated in the upper sub-chamber and an ion-ion plasma forms in the lower sub-chamber. The ion-ion plasma interacts with the device 901 to vertically etch the portions of the polysilicon layer 906 that are not protected by the photoresist mask 908.

Figure 10:
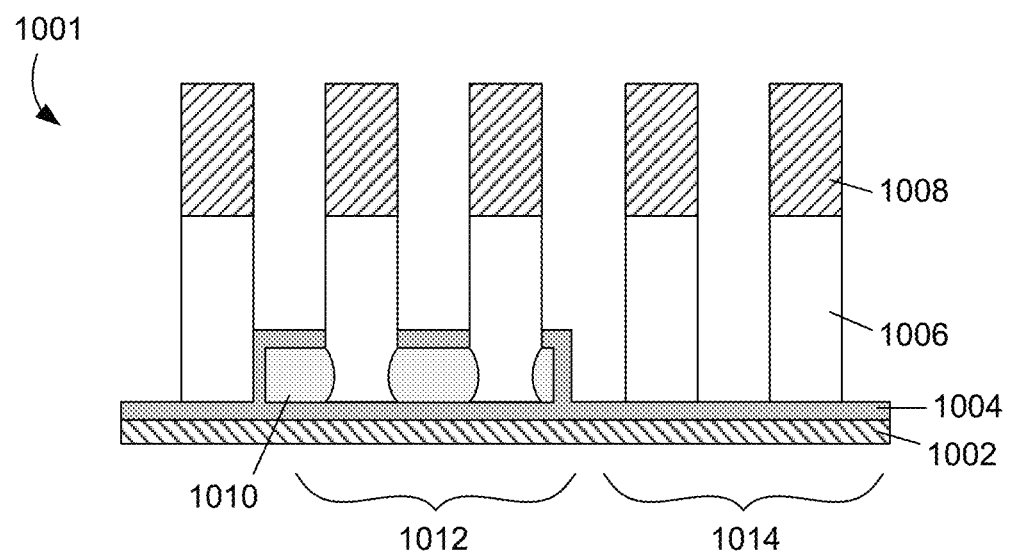
FIG. 10 shows cross-sectional and top-down views of a partially fabricated semiconductor device after a FinFET polysilicon gate etch.
Figure 10:
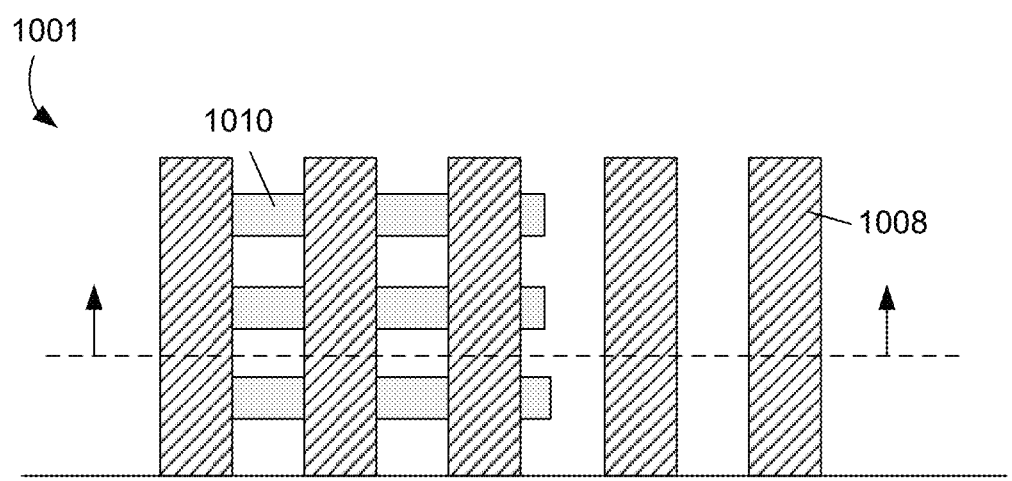

FIG. 10 shows a cross-sectional view (upper panel) and top-down view (lower panel) of a partially fabricated semiconductor device 1001 after a conventional FinFET polysilicon gate etch. This figure illustrates the problem of non-uniform profile loading between on-fin and off-fin regions of the device. The dotted line in the lower panel represents the cross-sectional plane used in the top panel. The device 1001 includes fin 1010 over silicon substrate 1002. These are covered by a protective oxide layer 1004. The fin 1010 shown the top panel of FIG. 10 is behind the plane of the drawing. In front of the fin, in the plane of the page, are etched gate structures formed from polysilicon 1006 with overlaying mask layer 1008. The protective oxide layer 1004 is shown both in the plane of the page, underlying the polysilicon gate structures 1006, as well as behind the plane of the page, on the fin structure 1010. As mentioned above, the mask layer 1008 may be silicon nitride in various cases. The location of the fin 1010 defines the on-fin region 1012 and off-fin region 1014.

One problem that arises when performing the FinFET polysilicon gate etch is the formation of non-volatile byproducts (e.g., $SiBr_x$ and $SiO_xBr_y$) that adhere to the sidewalls of the etched regions, thereby passivating the sidewalls to some extent. These byproducts are problematic in part because the byproducts affect isolated and dense regions of the substrate differently. For example, in the context of FIG. 10, the non-uniform byproduct formation and adsorption can lead to significant etching profile differences between the on-fin region 1012 and the off-fin region 1014. As shown in the figure, the polysilicon 1006 in the on-fin region 1012 may be overetched such that the remaining polysilicon 1006 has a curved etching profile rather than the desired vertical etching profile. In contrast, the etching profile in the off-fin region 1014 is vertical.

One method for reducing the differences between on-fin and off-fin regions is to use a very high gas flow rate to purge the chamber during etching. However, there is no currently available pump that is able to perform such a purge effectively across the entire wafer. Another method is to reduce the etch rate so that the rate of byproduct formation is lower, thus enabling better purging of the byproducts with high flow purge gas. This tactic is not desirable as it results in decreased throughput. Another method for minimizing or avoiding the differences between the on-fin and off-fin regions is to etch in an ion-ion plasma. By using this technique, the byproducts that are formed through etching remain volatile, since they are shielded from harsh plasma conditions present in the upper sub-chamber, and are therefore not cracked into non-volatile byproducts in the lower sub-chamber. As such, the non-volatile byproducts do not form, the sidewalls do not become passivated, and the volatile byproducts can be effectively removed, resulting in uniform etch profiles across all regions of the wafer.

To perform the FinFET polysilicon gate etch under an ion-ion plasma regime, plasma is generated in the upper sub-chamber from a plasma generation gas containing, for example HBr and $O_2$ or HBr and $CO_2$. The plasma generation gas may further include He STG. Below the grid, an ion-ion plasma forms and interacts with the substrate to etch the polysilicon to form a gate structure. The flow rate of HBr may be between about 100-500 sccm, for example between about 100-300 sccm. The flow rate of O2 may be between about 2-12 sccm, for example between about 3-6 sccm. The flow rate of He STG may be between about 200-400 sccm. The chamber pressure may be between about 5-25 mTorr, for example between about 10-20 mTorr. The substrate temperature may be between about 20-100° C. The power used to generate the plasma may be between about 300-1800 Watts per station, for example between about 1000-1600 Watts per station. The substrate may be biased to between about 100-500V, for example between about 200-400V. TCCT may be between about 0.25-0.75, for example between about 0.4-0.6.

The poly gate FinFET is etched with the proposed single-step chemistry to endpoint (EP), with additional time for a % over-etch. The following parameters can be tuned to further improve the etch performance: Pressure (5-20 mT), total flow (1×-3×), O2 flow, electrostatic chuck temperature (20 C-100 C), TCP power (300 W-1800 W), Bias voltage, bias voltage pulsing duty-cycle (100-200 Hz, 25-50%), $CO_2$ flow.

An alternative process condition may utilize low TCP and bias pulsing. The bias may be pulsed at a frequency between about 100-500 Hz, for example between about 150-300 Hz.

Another alternative condition utilizes low TCP, low bias and CO2. The flow rate of CO2 may be between about 2-12 sccm, for example between about 5-10 sccm.

The grid may be grounded to the chamber wall in various embodiments. In other implementations, the grid may be biased as described elsewhere herein.

Experimental results have shown that ion-ion plasma may be used to etch FinFET gates without producing unwanted results such as on-fin-off-fin profile differences encountered with conventional etching. Silicon residues are not seen post-etching, even in very small CD spaces (e.g., <2 nm). Further, the gates can be etched with minimal loss of mask, for example greater than about 70 nm mask remaining, with a loss of about 5 nm or less of mask height (a loss of less than about 10%). The results also show minimal loading between on-fin and off-fin regions, with vertical etching profiles in both cases.

Dummy Polysilicon Removal

Figure 11A:
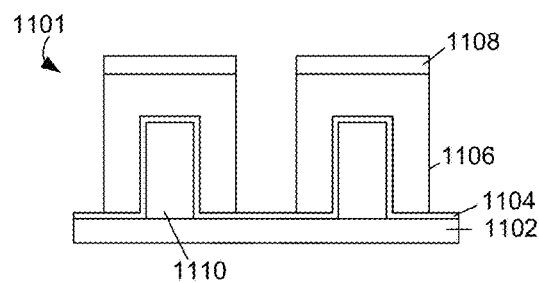
FIGS. 11A-11G show cross-sectional views of a partially fabricated semiconductor device during various stages of manufacture, including during a dummy polysilicon removal process.
Figure 11E:
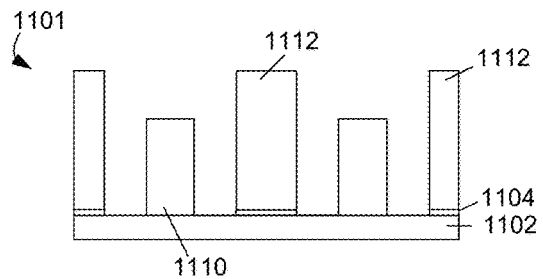
Figure 11B:
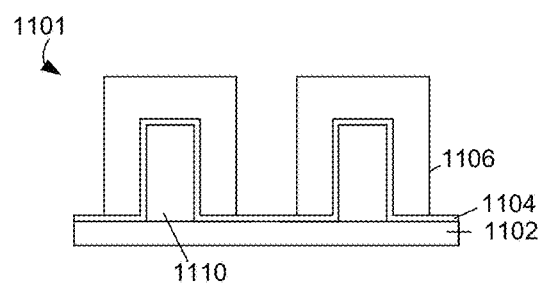
Figure 11F:
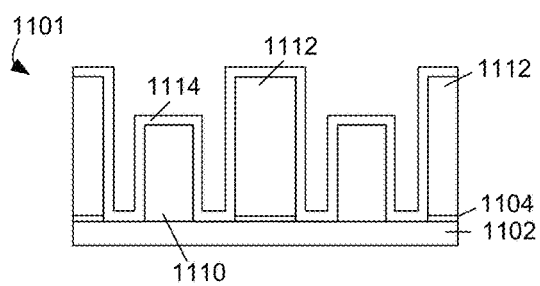
Figure 11C:
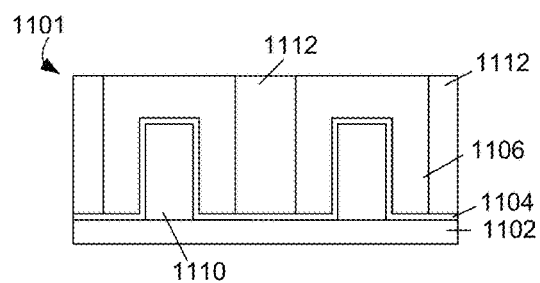
Figure 11G:
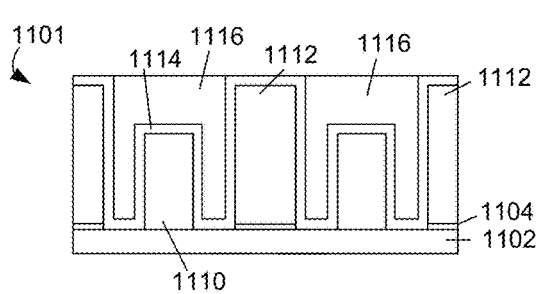
Figure 11D:
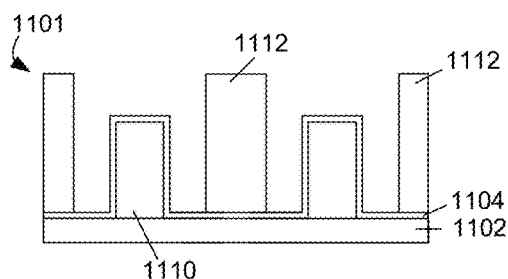

FIGS. 11A-11G show a partially fabricated semiconductor device at various stages of manufacture. After the FinFET polysilicon gate etch described in the above example, the device 1101 is as shown in FIG. 11A, with fins 1110 positioned over a silicon substrate 1102. Both the fins 1110 and substrate 1102 may be covered with a protective oxide layer 1104, which may be made from a material such as $SiO_2$. A mask layer 1108 may then be removed by plasma etch, as shown in FIG. 11B. Next, a dielectric material 1112 is deposited in the regions that were etched during the previous polysilicon gate etch, as shown in FIG. 11C. Dummy polysilicon material 1106 may then be removed, forming a cavity where the final gate will be. FIG. 11D shows the device 1101 after removal of the dummy polysilicon material 1106. This removal process may be referred to as the dummy polysilicon removal, and is the focus of this example. After the dummy polysilicon is removed, a wet etch may be performed to remove the underlying protective oxide layer 1104 (e.g., a silicon dioxide layer), as shown in FIG. 11E. After the wet etch, a new protective oxide layer 1114 (e.g., a hafnium oxide layer 1114) may be deposited. Then, the final desired gate material(s) 1116 (e.g., one or more of tantalum, titanium, tungsten, and combinations thereof) may be deposited into the cavity formed when the dummy polysilicon was removed, as shown in FIG. 11G. Another way to describe the dummy polysilicon removal is that the polysilicon is being etched to form cavities in locations where a FinFET gate will be positioned in a completed integrated circuit. The locations referred to are the actual locations of the etched cavities (not the entire polysilicon layer or spaces between the etched cavities).

Similar non-volatile byproduct formation issues arise in the dummy polysilicon removal process as are described in relation to the FinFET polysilicon gate etch above. In particular, conventional plasma processes utilize an HBr/$O_2$ chemistry to remove the dummy polysilicon. This results in the formation of volatile byproducts. However, once the volatile byproducts contact the conventional plasma, many of the molecules crack into smaller non-volatile molecules that attach to sidewalls and other portions of the partially fabricated device. These non-volatile molecules effectively passivate the sidewalls and contribute to non-vertical etch profiles.

By instead performing this etch in an ion-ion plasma regime, the formation of non-volatile byproducts is avoided in two ways. First, the low ion concentration and low electron density properties of the ion-ion plasma allow a different chemistry to be used to remove the dummy polysilicon without removing the underlying protective silicon oxide material that may be covering the fin. In various cases, dummy polysilicon removal may be accomplished in a two step process, with each step employing an ion-ion plasma. The first step may involve etching the substrate in a first plasma (e.g., an HBr-based plasma) to remove the bulk of the dummy polysilicon. After this first etching step, some material may remain on the substrate, particularly at the corners of the features near the fins. Often this remaining material is polysilicon residue. The second step of the process may involve etching the substrate in a second plasma (e.g., an $NF_3/Cl_2$-based plasma) to remove the corner residues.

In various cases, the dummy polysilicon may be removed using a process gas that is free or substantially free of oxygen-containing etchants. As used herein, substantially free of oxygen-containing reactants means trace amounts or less of oxygen-containing reactants. By using a $Cl_2$-based chemistry in the second step, the formation of certain non-volatile byproducts (e.g., $SiO_xBr_y$) can be avoided, as there is no oxygen available to form such byproducts.

Further, the ion-ion plasma reduces or avoids non-volatile byproduct formation, even where a conventional HBr/$O_2$ chemistry is used, because any byproducts (e.g., volatile byproducts) that form in the lower sub-chamber are not exposed to the harsh plasma conditions of the upper sub-chamber. Instead, the ion-ion plasma in the lower sub-chamber is sufficiently gentle (i.e., low electron temperature, low electron density, etc.) such that substantially none of the volatile byproducts are cracked into non-volatile materials, and the byproducts may therefore be removed from the reaction chamber without redepositing on the substrate.

Figure 12:
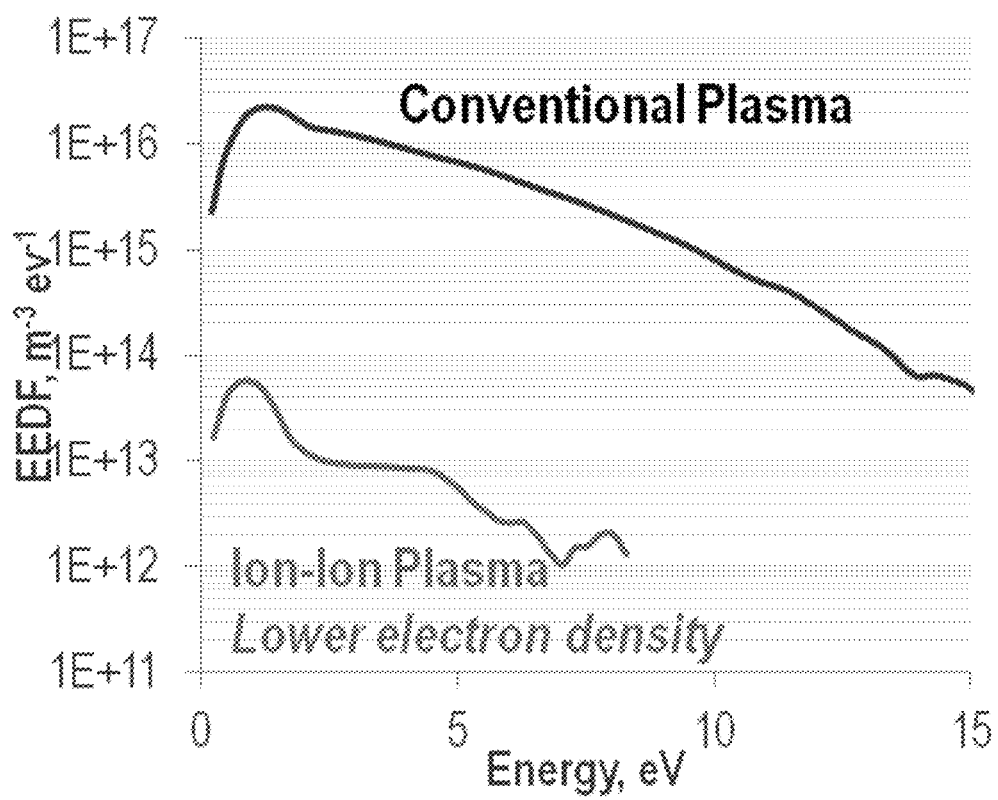
FIG. 12 shows the electron energy distribution function for an ion-ion plasma and for a conventional plasma.

FIG. 12 shows an electron energy distribution function for a conventional plasma and an ion-ion plasma. The ion-ion plasma is has a substantially lower electron density (about three orders of magnitude less), and lower energy than the conventional plasma. These gentle conditions help prevent cracking of volatile byproducts into non-volatile byproducts.

The reattachment of non-volatile byproducts is especially problematic in the context of dummy polysilicon removal because the presence of such byproducts can significantly interfere with the subsequent wet etch process, mentioned above. This wet etch process is performed to remove the silicon oxide material, and should not remove any surrounding/adjacent silicon material. In various cases, the wet etch is performed with hydrofluoric acid. The HF is very good at removing pristine $SiO_2$, but is not effective in removing silicon-based materials that do not have a sufficient amount of oxygen, such as the non-volatile byproduct materials that form during removal of the dummy polysilicon. Therefore, where byproducts are present, they are often not removed by the wet etch. In short, there is no known chemistry/process that can remove the silicon-based non-volatile byproducts without removing the surrounding silicon material (e.g., in the fins), which is needed for device performance. As such, it is desirable to reduce or avoid formation of such non-volatile byproducts in the first place.

As mentioned, in certain embodiments, the dummy polysilicon removal is accomplished in two steps: a main etch and an overetch. The main etch may involve etching with an HBr/He plasma, and the overetch may involve etching with an $NF_3/Cl_2$ plasma. Some amount of polysilicon-based residues may be present on the substrate after the main etch, for example in the bottom corners of the etched areas. The overetch may be performed to remove all of the polysilicon-based residues. The low plasma density of the ion-ion plasma results in a low ion flux to the surface of the substrate. Thus, the overetch process can be primarily a chemical-driven process, which has very high selectivity and can therefore be used to effectively remove the residues without damaging the fin.

During the main etch in the ion-ion plasma regime, HBr may be provided at a rate between about 300-850 sccm, for example between about 400-600 sccm, and He may be provided at a rate between about 500-1000 sccm, for example between about 700-900 sccm He. Plasma is generated in the upper sub-chamber from the HBr/He. An ion-ion plasma forms in the lower sub-chamber and interacts with the substrate to remove the polysilicon to form a cavity where the final gate structure will be located. The chamber pressure may be between about 20-80 mTorr, for example between about 60-80 mTorr. The chamber temperature may be between about 40-60° C. The substrate temperature may be between about 30-80° C., for example between about 50-75° C. The power used to generate the plasma may be between about 200-1500 W/station, for example between about 1000-1500 W/station. The RF frequency used to generate the plasma may be about 13.56 MHz. The substrate may be biased between about 40-150 V, for example between about 80-130V bias. A single main etch for a FinFET dummy polysilicon removal process may have a duration between about 30-100 seconds.

During the overetch portion of the dummy polysilicon removal, plasma is generated from etching chemistry such as $NF_3$ and $Cl_2$ in the upper sub-chamber. An inert gas may also be provided to the reaction chamber as part of the plasma generation gas. An ion-ion plasma forms in the lower sub-chamber and interacts with the substrate to remove any polysilicon residues present in the etched areas. The $NF_3$ may flow at a rate between about 0-60 sccm, for example between about 20-50 sccm, and the $Cl_2$ may flow at a rate between about 10-100 sccm, for example about 40-70 sccm.

Inert gas such as Ar may flow at a rate between about 30-200 sccm, for example about 40-100 sccm Ar. The chamber pressure may be between about 4-80 mTorr, for example about 30-60 mTorr. The chamber temperature may be between about 40-60° C. The substrate temperature may be between about 30-80° C., for example about 50-70° C. The power used to generate the plasma may be between about 200-1000 W/station, for example about 200-400 W/station. The RF frequency used to generate the plasma may be about 13.56 MHz. The substrate may remain unbiased. A single overetch for a FinFET dummy polysilicon removal process may have a duration between about 10-60 seconds, for example about 30-60 seconds.

Photoresist Reflow

Photoresist reflow processes are used in both front-end-of-line (FEOL) and back-end-of-line (BEOL) processes that require feature dimensions (e.g., lines, spaces) less than about 30 nm in width. Current photolithography patterning techniques using traditional 193 nm photoresist have been unable to achieve good patterning at these dimensions. As such, extreme ultraviolet (EUV) photoresist is beginning to replace the traditional 193 nm photoresist. Although the EUV photoresist may be used to better pattern the smaller features, the EUV photoresist processes still suffer from other problems seen in the 193 nm photoresist. For instance, etched photoresist in FEOL applications typically exhibit relatively large incoming line-width-roughness (LWR), which ranges from about 5-10 nm. One goal of the photoresist reflow is to reduce this LWR to less than about 3.0 nm post etch. Another issue with FEOL applications is that there is often insufficient etch resistance/selectivity to the underlayer. This insufficient etch resistance is exacerbated by the fact that where EUV photoresist is used, the thickness of the photoresist is about 50-70% less than the thickness used with 193 nm photoresist. In other words, because there is less photoresist available to protect the underlying layers, the etch resistance of the underlying layers is poor.

BEOL applications, in addition to having small feature dimensions, may require the simultaneous transfer of concave/convex patterns. Like the FEOL applications above, it is desired that the LWR of the lines/spaces be reduced to about 3.0 nm or less after etch. Further, it is often desired that all patterns on the wafer are shrunk by about 10-30%, and it is important that such shrinking occurs uniformly for all of the patterns. Unequal shrinking of lines/convex/concave patterns is referred to as x-loading. When processing with a conventional plasma, there are significant tradeoffs between improving LWR and improving x-loading.

Figure 13:
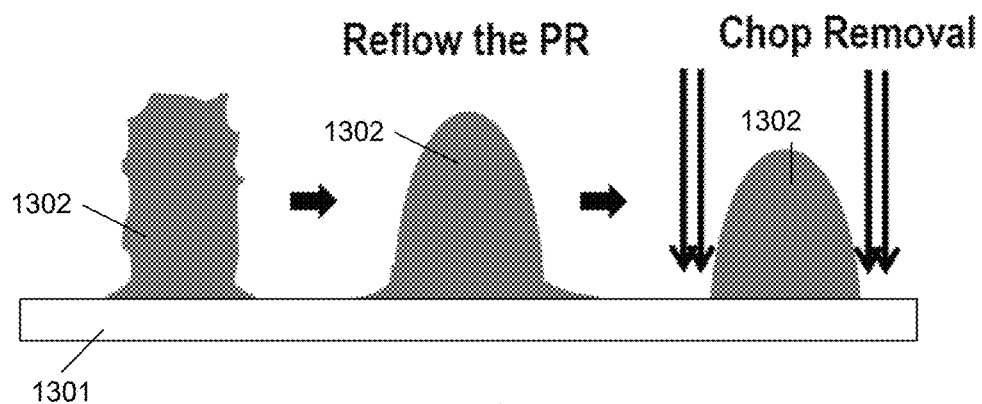
FIG. 13 illustrates a substrate with photoresist thereon during a photoresist reflow process.

FIG. 13 shows a portion of a semiconductor device as it undergoes a photoresist reflow process. Photoresist 1302 is positioned on underlying material 1301. Plasma photoresist reflow methods typically involve a two-step plasma pretreatment process, as shown in the figure. At the beginning of the process, the photoresist is relatively rough. In order to smooth out the photoresist, the first step of the reflow process involves generating a plasma (e.g., from $H_2$) to reflow the photoresist. The next step in the photoresist reflow process involves generating a plasma (e.g., from Ar) to remove any extra photoresist that flowed down into the foot region. The result is a relatively smooth photoresist with little or no photoresist foot remaining.

As the photoresist becomes smoother in the first plasma treatment, it also starts to flow/sag downwards, as if it were slowly melting. Although this is beneficial for smoothing out any roughness in the photoresist, thereby improving LWR, this flow/sag also results in the photoresist becoming shorter/thinner, and flowing out at the foot of the resist, as shown in FIG. 13. The relatively high rate of photoresist reflow achieved with conventional plasma results in significant decreases in mask height, which leads to poor etch selectivity to underlying layers, poor transfer of the improved LWR to the underlying layers, and poor pattern transfer of concave/convex features. These factors all promote high x-loading, which is not desirable.

By instead processing in an ion-ion plasma regime, the rate of photoresist reflow can be slowed, and the tradeoff between LWR and x-loading can be minimized. The ion-ion plasma processing achieves equivalent LWR improvement as seen with conventional plasma, but involves a slower rate of reflow, less consumption of photoresist height (i.e., less sagging), and less CD bias loading of different pattern shapes. Because less photoresist height is consumed with an ion-ion plasma, the photoresist budget is extended and the selectivity of the underlying layer is improved, as there is more photoresist remaining to help protect the underlying layer. The ion-ion plasma may be used to reflow both EUV and 193 nm photoresist, and other types of photoresist as appropriate.

The low electron density of the ion-ion plasma helps prevent localized heating of the photoresist material. This slows the rate of photoresist reflow and allows the photoresist foot to be removed relatively gently, minimizes the amount of photoresist loss. Further, the low electron density of the ion-ion plasma allows for a low overall ion density, which correlates to a low ion flux to the surface. This helps reduce the amount of photoresist loss arising from ion bombardment. Bias pulsing may be used to provide extra control of the ion flux.

The range of total bias voltage applied to the substrate (via lower electrode) can be increased when using ion-ion plasma. The low ion flux reduces the total energy flux to the substrate surface. As such, we were previously limited to bias voltage (and total energy flux) of <30V. Note, bias voltage is also dependent on ion size. The larger the ion, the less bias you can apply. The bias voltage is responsible for chopping off the photoresist foot. However, if the bias is too high, it will induce crosslinking in the photoresist. Crosslinking causes the photoresist to harden and to buckle over time as the total energy flux increases. Therefore in high ion energy flux systems, the bias voltage must be kept low. In the ion-ion plasma system, however, the total ion flux is low, so the total bias voltage applied can be increased. The higher bias voltage (Vb) is more effective in chopping the photoresist foot off, without inducing the photoresist crosslinking effect. Bias voltages can go as high as 200 Vb when using the ion-ion plasma.

As mentioned, a photoresist reflow process may involve two main operations. The first operation is the reflow step, and the second operation is the foot chopping step. To perform the first step in an ion-ion plasma regime, plasma is generated in the upper sub-chamber from a plasma generation gas containing, for example, $H_2$. In certain other cases, the plama generation gas may be Ar, $H_2$/HBr, Ar/HBr, or HBr. Further, the plasma generation gas may include inert gas such as $N_2$ and/or HeSTG. The flow rate of $H_2$ may be between about 100-500 sccm, for example between about 100-300 sccm. The flow rate of $N_2$ may be between about 0-300 sccm, and the flow rate of HeSTG may be between about 0-100 sccm. Below the grid, an ion-ion plasma forms and interacts with the substrate to reflow the photoresist. The total flow rate of plasma generation gas may be between about 100-500 sccm. The chamber pressure may be between about 5-20 mTorr. The substrate temperature may be between about 20-60° C. The power used to generate the plasma may be between about 300-1000 Watts per station. The substrate may be biased between about 0-200 V, for example between about 50-200 V. A single photoresist reflow operation may have a duration between about 5-45 seconds, for example between about 5-30 seconds. TCCT may be between about 0.5-1.5, for example between about 1-1.5.

The following parameters can be tuned to further improve the etch performance: Pressure (5-20 mT), total flow (100-500 sccm), H2 flow (0-300 sccm), electrostatic chuck temperature (20-60° C.), TCP power (300-1000 W), Bias voltage on substrate (0-200V), bias voltage pulsing duty-cycle (100-200 Hz, 250=−50%), process time (5-30 s).

An alternative method utilizes a single step $H_2$ condition to do both photoresist reflow and foot chopping. In this case, the plasma generation gas may include, for example, $H_2$, $N_2$ and HeSTG.

Returning to the embodiment of a two step reflow process, the second step of the photoresist reflow process may be performed in an ion-ion plasma regime. The plasma is generated in the upper sub-chamber from a plasma generation gas containing, for example, Ar (in some cases the plasma generating gas for this step includes HBr or HBr/Ar). The other process conditions may be the same as those described above with relation to the first photoresist reflow process.

In one example, a substrate begins with patterned EUV photoresist thereon. The LWR of the patterned photoresist is about 6 nm, and the photoresist has a height of about 60 nm. A photoresist reflow operation is performed in an ion-ion plasma generated from $H_2$. In a second operation, photoresist foot removal is performed in an ion-ion plasma generated from Ar. Through these two plasma treatments, the LWR is reduced to about 3.7 nm, and the photoresist height is reduced to about 40 nm.

Shallow Trench Isolation Etch

Shallow trench isolation (STI) may be used to prevent electrical current from leaking between adjacent transistors. The trenches operate to isolate the transistors from one another. Key steps in forming the STI structures include etching a pattern of trenches into the substrate (e.g., silicon), depositing dielectric materials to fill the trenches, and removing the excess dielectric using techniques such as chemical-mechanical polishing (CMP). At small feature dimensions, STI etching processes show aspect ratio-dependent etch depth and profile results. In other words, high aspect ratio structures, which are often present in dense feature regions, show different etching results than low aspect ratio structures, which are often present in more isolated regions. It is believed that this aspect ratio dependency results due to the different concentrations of etchants and byproducts in the two types of features.

Figure 14:
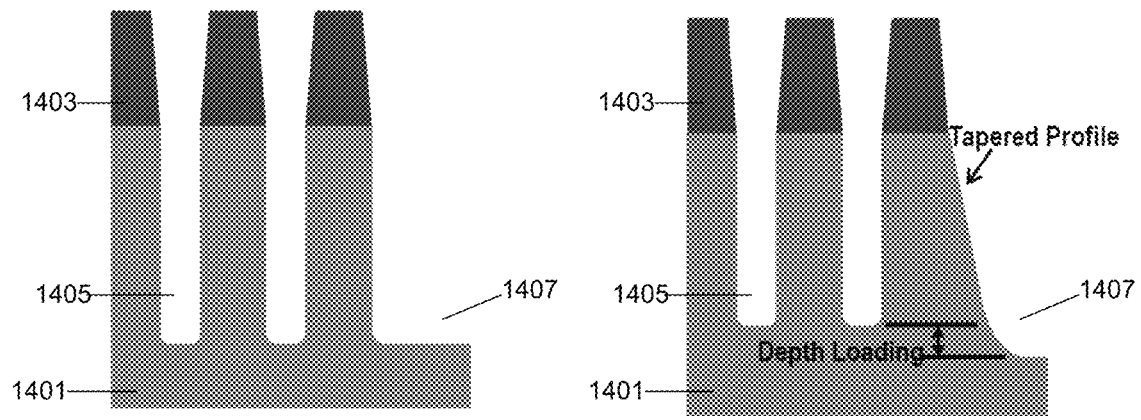
FIG. 14 illustrates different etching profiles for a substrate etched during a shallow trench isolation process.

FIG. 14 illustrates the profile loading problem. The left panel of FIG. 14 shows a desired etching profile for substrate 1401. The substrate 1401 has a mask layer 1403 used to define where the trenches will be etched. The high aspect ratio feature 1405 and the low aspect ratio feature 1407 should both have a vertical etch profile. The right panel of FIG. 14 shows the etching profile typically achieved with a conventional plasma etch. The high aspect ratio feature 1405 shows a vertical etch profile, but the low aspect ratio feature 1407 shows a much more tapered profile. These differences are referred to as profile loading. Further, the low aspect ratio feature 1407 etches to a greater extent, resulting in a lower etch depth for the isolated feature 1407. This etch depth difference is referred to as etch depth loading or depth loading. Both profile loading and etch depth loading should be minimized.

One technique for minimizing the non-uniformity of etching results between the high aspect ratio dense features and the low aspect ratio isolated features is to use bias pulsing. By pulsing the bias applied to the substrate, the diffusion of etchants into the features may become more uniform between the two types of features, which results in a more equivalent radical:ion flux to the two types of features. Bias pulsing may also reduce the total flux of byproducts from the wafer to the bulk plasma, which minimizes the total amount of byproducts in the chamber. Because the presence of byproducts in the chamber is one factor that contributes to the etching profile differences between high aspect ratio dense and low aspect ratio isolated features (i.e., profile loading), a reduction in the amount of byproducts in the chamber advantageously minimizes the amount of profile loading.

Superior STI etching results can be achieved by performing the etching process in an ion-ion plasma regime. The ion-ion plasma is beneficial for a number of reasons. First, the ion-ion plasma has a lower total ion density than a conventional plasma. This low ion density reduces the aspect ratio-dependency of the etch depth at least in part by achieving a higher radical:ion flux ratio to the substrate surface. Bias pulsing may be used in the ion-ion plasma context to achieve more uniform radical:ion flux ratios between the high aspect ratio dense structures and the low aspect ratio isolated structures. The radical:ion flux is more uniform between these two types of structures where an ion-ion plasma is used, as compared to a conventional plasma.

Further, the ion-ion plasma is beneficial because the low ion flux of the ion-ion plasma minimizes the rate of byproduct formation. Where the byproducts are formed more slowly, they can be more thoroughly removed from the reaction chamber before they become dissociated into non-volatile byproducts. These non-volatile byproducts contribute to the etching profile differences seen between the two types of features. As such, slower byproduct formation results in more efficient byproduct removal, which in turn results in more uniform etching profiles between high aspect ratio and low aspect ratio features.

Another benefit of the ion-ion plasma is that as volatile byproducts form during etching, they are much less likely to dissociate into problematic non-volatile byproducts due to the low electron density and low electron temperature of the ion-ion plasma. This allows the volatile byproducts to be removed much more efficiently, before they are dissociated into non-volatile ("sticky") byproducts. Since the byproducts can be better removed from the chamber, there is substantially less profile loading between the high aspect ratio dense and low aspect ratio isolated features, and the etching results are more uniform.

Figure 15:
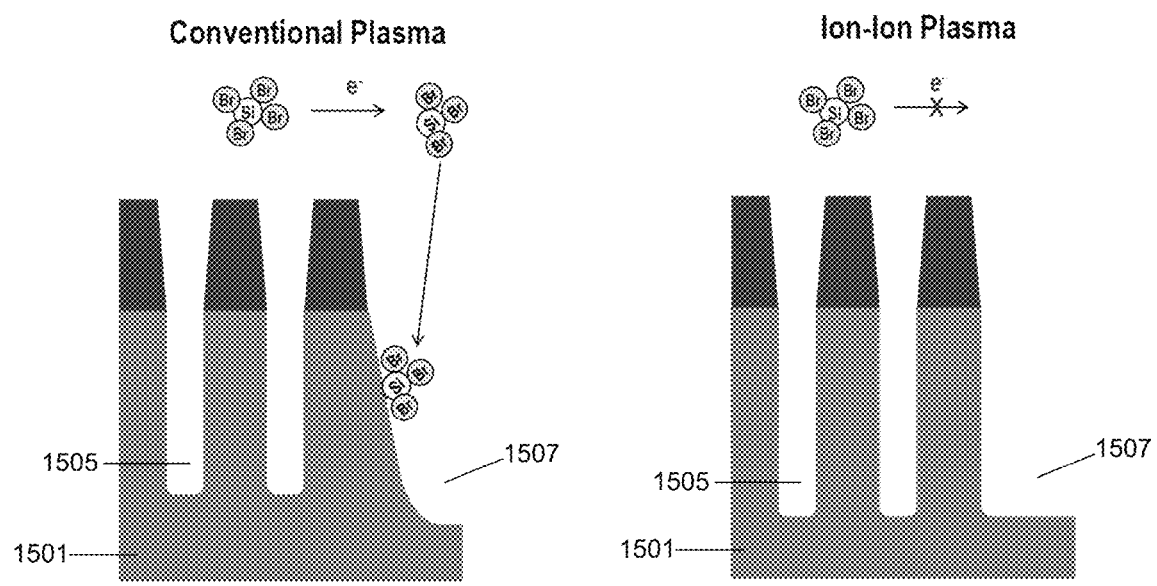
FIG. 15 shows the etching profiles achieved during a shallow trench isolation process using a conventional plasma and using an ion-ion plasma.

FIG. 15 illustrates an STI etching process under a conventional plasma (left panel) and under an ion-ion plasma (right panel). Where a conventional plasma is used, the relatively high electron density and high electron temperature result in dissociation of volatile $SiBr_4$ into non-volatile $SiBr_3$, for example. The non-volatile $SiBr_3$ then attaches onto the substrate 1501, often in a low aspect ratio feature 1507. In contrast, where an ion-ion plasma is used, the electron temperature and density are sufficiently low such that the $SiBr_4$ substantially does not dissociate into non-volatile byproducts, and can instead be effectively removed from the chamber in volatile form. As such, the non-volatile byproducts are much less problematic, there is less sidewall passivation, and the etching profile is vertical for both high aspect ratio features 1505 and low aspect ratio features 1507.

In some embodiments, an STI etching process may involve simultaneously etching at least two different types of features, a high aspect ratio feature and a low aspect ratio feature. The high aspect ratio feature may have an aspect ratio of about 10 or higher, while the low aspect ratio feature may have an aspect ratio of about 1 or lower. The plasma generating gas may include HBr and $Cl_2$. After etching in an ion-ion plasma, the etch depth of the high aspect ratio feature may be about 150 nm, and the etch depth of the low aspect ratio feature may be about 155 nm. The etch depth of the high aspect ratio feature may be at least about 95%, of the etch depth of the low aspect ratio feature. In other words, the two etch depths may be very similar. In some cases, the difference between the etch depth of the high and low aspect ratio features is about 5 nm or less. Further, the etching profile of the high aspect ratio feature may be at least about 88° (90° being perfectly vertical), and the etching profile of the low aspect ratio feature may be at least about 85°.

To perform a shallow trench isolation etching process in an ion-ion plasma regime, plasma is generated in the upper sub-chamber from a plasma generation gas containing, for example, HBr. Below the grid, an ion-ion plasma forms and interacts with the substrate to etch the substrate material. The flow rate of plasma generation gas may be between about 50-500 sccm. The chamber pressure may be between about 2-100 mT, for example between about 5-90 mT. The chamber temperature may be between about 50-130° C. The substrate temperature may be between about 20-100° C. The power used to generate the plasma may be between about 300-1500 W per station. The RF frequency used to generate the plasma may be around 13 MHz. The substrate may be biased between about 300-1200V. A single STI etching operation may have a duration between about 30-100 sec.

Apparatus

The methods described herein may be performed by any suitable apparatus. A suitable apparatus includes a chamber and electronic hardware for providing and maintaining etching conditions as described herein. Suitable apparatus will also include a system controller having instructions for controlling the hardware to achieve these conditions and for performing a sequence of process operations appropriate for applications such as etching a gate electrode of an FET. In some embodiments, the hardware may include one or more process stations included in a process tool.

Returning to FIG. 1, a cross-sectional view of an inductively coupled plasma etching apparatus 100 in accordance with certain embodiments is shown. As mentioned previously, the embodiments herein may be practiced with non-inductively coupled plasmas, as well. The inductively coupled plasma etching apparatus 100 includes an overall etching chamber structurally defined by chamber walls 101 and a window 111. The chamber walls 101 are typically fabricated from stainless steel or aluminum. The window 111 is typically fabricated from quartz or other dielectric material. An internal plasma grid 150 divides the overall etching chamber into an upper sub-chamber 102 and a lower sub-chamber 103. In certain other implementations, a more complex plasma grid assembly is used. For example, the plasma grid assembly may include multiple grids, as well as support structures and movement causing elements, as illustrated in FIGS. 4 and 5. Returning to the embodiment of FIG. 1, a chuck 117 is positioned within the lower sub-chamber 103 near the bottom inner surface. The chuck 117 is configured to receive and hold a semiconductor wafer (i.e., "wafer") 119 upon which the etching process is performed. The chuck 117 can be an electrostatic chuck for supporting the wafer when present. In some embodiments, an edge ring (not shown) surrounds chuck 117, and has an upper surface that is approximately planar with a top surface of a wafer, when present over chuck 117. The chuck 117 also includes electrostatic electrodes to enable the chucking and dechucking of the wafer. A filter and a DC clamp power supply may be provided for this purpose. Other control systems for lifting the wafer off of the chuck 117 can also be provided. The chuck 117 can be electrically charged using an RF power supply 123. The RF power supply 123 is connected to matching circuitry 121 through a connection 127. The matching circuitry 121 is connected to the chuck 117 through a connection 125. In this manner, the RF power supply 123 is connected to the chuck 117.

A coil 133 is positioned above the window 111. The coil 133 is fabricated from an electrically conductive material and includes at least one complete turn. The exemplary coil 133 shown in FIG. 1 includes three turns. The cross-sections of coil 133 symbols having an "X" indicate that the coil 133 extends rotationally into the page. Conversely, the coil 133 symbols having a "•" indicate that the coil 133 extends rotationally out of the page. An RF power supply 141 is configured to supply RF power to the coil 133. In general, the RF power supply 141 is connected to matching circuitry 139 through a connection 145. The matching circuitry 139 is connected to the coil 133 through a connection 143. In this manner, the RF power supply 141 is connected to the coil 133. An optional Faraday shield 149 is positioned between the coil 133 and the window 111. The Faraday shield 149 is maintained in a spaced apart relationship relative to the coil 133. The Faraday shield 149 is disposed immediately above the window 111. The coil 133, the Faraday shield 149, and the window 111 are each configured to be substantially parallel to one another. The Faraday shield may prevent metal or other species from depositing on the dielectric window of the plasma chamber.

Process gases may be supplied through a main injection port 160 positioned in the upper chamber and/or through a side injection port 170, sometimes referred to as an STG. Gas exhaust ports are not shown. Also not shown are pumps connected to the chamber 101 to enable vacuum control and removal of gaseous byproducts from the chamber during operational plasma processing.

During operation of the apparatus, one or more reactant gases may be supplied through the injection ports 160 and/or 170. In certain embodiments, gas may be supplied only through the main injection port, or only through the side injection port. In some cases, the injection ports may be replaced by showerheads. The Faraday shield 149 and/or grid 150 may include internal channels and holes that allow delivery of process gas to the chamber. In other words, either or both of Faraday shield 149 and grid 150 may serve as a showerhead for delivery of process gas.

Radiofrequency power is applied from the RF power supply 141 to the coil 133 to cause an RF current to flow through the coil 133. The RF current flowing through the coil 133 generates an electromagnetic field about the coil 133. The electromagnetic field generates an inductive current within the upper sub-chamber 102. The inductive current acts on the gas present in the upper sub-chamber 102 to generate an electron-ion plasma in the upper sub-chamber 102. The internal plasma grid 150 limits the amount of hot electrons in the lower sub-chamber 103. In various embodiments, the apparatus is designed and operated such that the plasma present in the lower sub-chamber is an ion-ion plasma.

Both the upper electron-ion plasma and the lower ion-ion plasma will contain positive ions and negative ions, though the ion-ion plasma will have a greater ratio of negative ions:positive ions. The physical and chemical interactions of the various ions and radicals with the wafer 119 selectively etch features of the wafer. Volatile etching byproducts are removed from the lower sub-chamber through an exhaust port (not shown). Importantly, these volatile byproducts are not substantially exposed to hot electrons, and therefore they are not likely to be dissociated into non-volatile "sticky" dissociation products.

Typically, the chuck disclosed herein operates at elevated temperatures ranging between about 30° Celsius and about 250° Celsius, preferably between about 30-150° Celsius. The temperature will depend on the etching process operation and specific recipe. The chamber 101 will also operate at pressures in the range of between about 1 mTorr and about 95 mTorr, or between about 5-20 mTorr.

Although not shown, chamber 101 is typically coupled to facilities when installed in a clean room, or a fabrication facility. Facilities include plumbing that provide processing gases, vacuum, temperature control, and environmental particle control. These facilities are coupled to chamber 101, when installed in the target fabrication facility. Additionally, chamber 101 may be coupled to a transfer chamber that will enable robotics to transfer semiconductor wafers into and out of chamber 101 using typical automation.

Figure 2A:
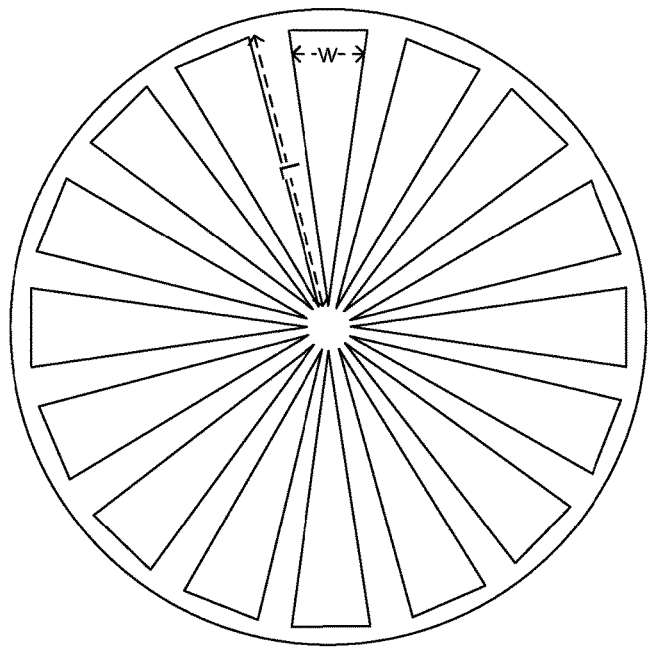
FIG. 2A is a simplified top-down view of a grid structure in accordance with certain embodiments disclosed herein.
Figure 2B:
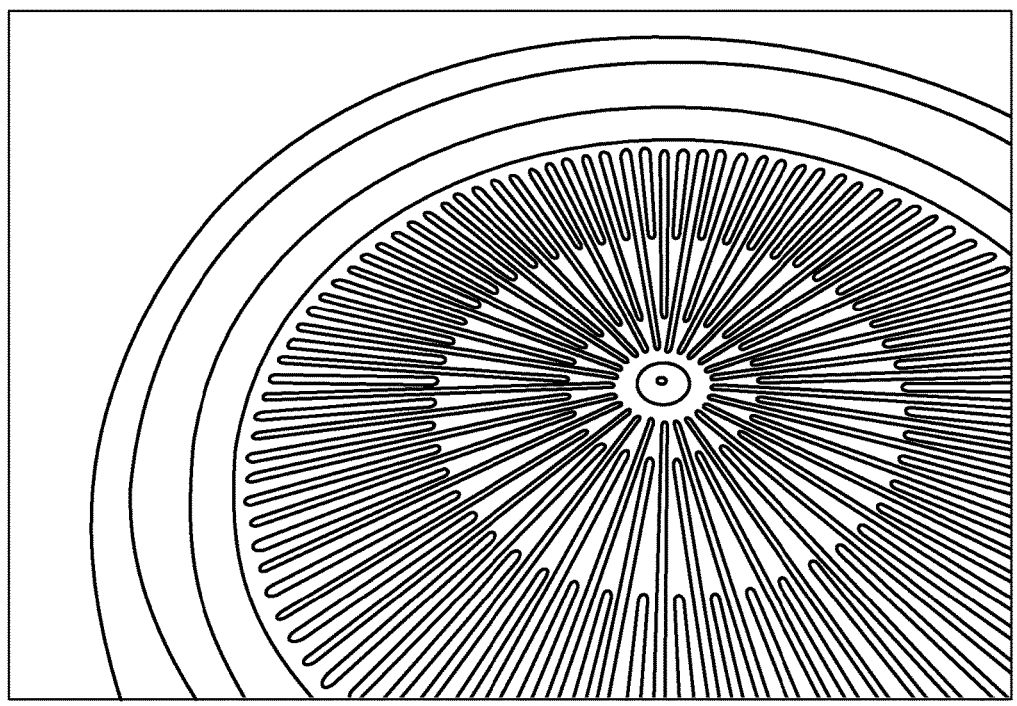
FIG. 2B is a picture of a grid structure in accordance with certain embodiments herein.
Figure 3C:
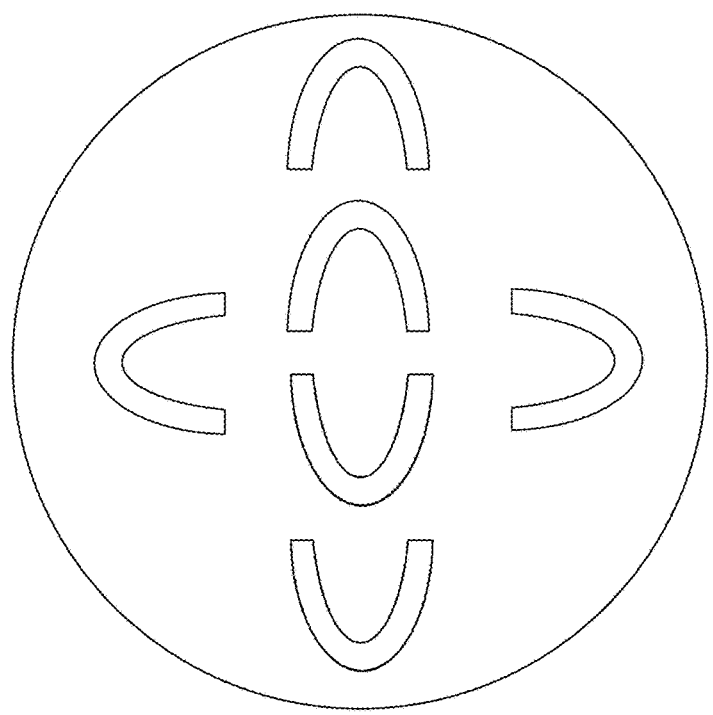
FIGS. 3C and 3D illustrate a pair of plasma grids having C-shaped slots according to an embodiment herein.
Figure 3D:
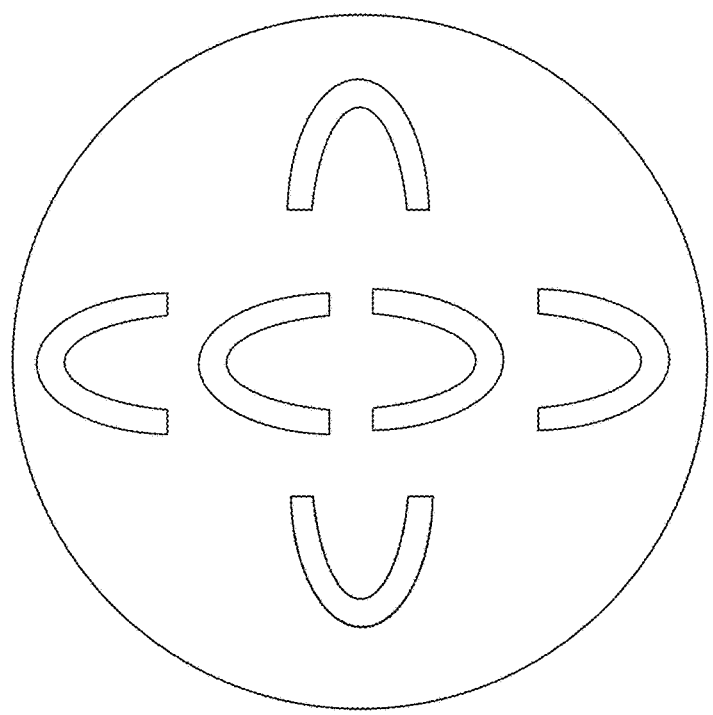
Figure 3E:
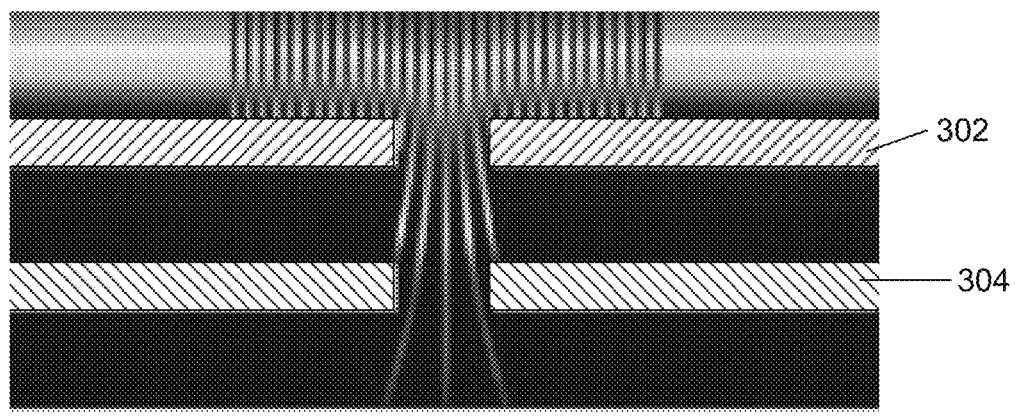
FIGS. 3E and 3F show the trajectory of ions through apertures in a rotatable grid.
Figure 3F:
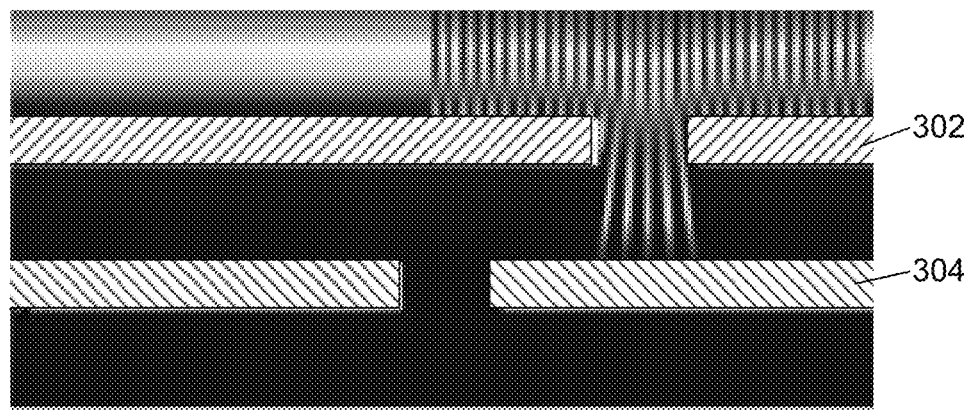

FIGS. 2A, 2B and 3A-3D show examples of internal plasma grids in accordance with the embodiments herein. In certain cases, each grid may have slots that extend radially outward or roughly radially outward. In these or other cases, the slots may have a more unusual non-linear shape, as shown in FIGS. 3C and 3D. In the embodiment of FIG. 2B, there are three types of slots. Each of the three slot types has a different slot length. The slots shown in FIG. 2B have an aspect ratio that is suitable for creating an ion-ion plasma in the lower sub-chamber, as described above. The slots shown in FIGS. 2A and 3A-3D may not be drawn to scale.

System Controller

In some embodiments, a system controller (which may include one or more physical or logical controllers) controls some or all of the operations of an etching chamber. The system controller may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any one or more of the following chamber operational conditions: the mixture and/or composition of gases, chamber pressure, chamber temperature, wafer temperature, the bias applied to the wafer, the frequency and power applied to coils or other plasma generation components, wafer position, wafer movement speed, grid position, grid movement speed, and other parameters of a particular process performed by the tool. System control software may be configured in any suitable way. For example, various process tool component subroutines or control objects may be written to control operation of the process tool components necessary to carry out various process tool processes. System control software may be coded in any suitable computer readable programming language.

In some embodiments, system control software includes input/output control (IOC) sequencing instructions for controlling the various parameters described above. For example, each phase of a semiconductor fabrication process may include one or more instructions for execution by the system controller. The instructions for setting process conditions for an etching phase may be included in a corresponding etching recipe phase, for example. In some embodiments, the recipe phases may be sequentially arranged, so that all instructions for a process phase are executed concurrently with that process phase.

Other computer software and/or programs may be employed in some embodiments. Examples of programs or sections of programs for this purpose include a substrate positioning program, a grid assembly positioning program, a process gas composition control program, a pressure control program, a heater control program, and an RF power supply control program.

In some cases, the controllers control gas concentration, wafer movement, grid movement, and/or the power supplied to the coils and/or electrostatic chuck. The controller may control the gas concentration by, for example, opening and closing relevant valves to produce one or more inlet gas streams that provide the necessary reactant(s) at the proper concentration(s). The wafer movement may be controlled by, for example, directing a wafer positioning system to move as desired. The grid movement may be controlled by directing movement causing elements (e.g., a rotational actuator, lifter and/or other movement causing component) to position the grid assembly as desired. In one example the controller directs the rotational actuator to rotate one or more plasma grids to achieve certain plasma conditions (including but not limited to electron temperature, electron density, ion density, positive ion to electron ratio, etc.) in the lower zone plasma. In some implementations, the controller is configured to achieve different plasma conditions over different parts of the wafer (e.g., the plasma conditions may be radially tuned). The power supplied to the coils and/or chuck may be controlled to provide particular RF power levels to create the desired electron-ion plasma in the upper sub-chamber. Further, the controller may be configured to supply power to an electrostatic chuck under conditions such that an electron-ion plasma does not form in the lower sub-chamber. In other words, the controller is configured to maintain an ion-ion plasma (or at least a plasma with a suitably low effective electron temperature and density) in the lower sub-chamber. The controllers may control these or other aspects based on sensor output (e.g., when power, potential, pressure, etc. reach a certain threshold), the timing of an operation (e.g., opening valves at certain times in a process) or based on received instructions from a user.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

Experimental

Experiments have confirmed that the presently disclosed methods and apparatus provide for improved etching of partially fabricated devices on semiconductor substrates. When using a plasma grid, the etched product shows good selectivity, profile angle, iso/dense loading, and overall etch uniformity.

Figure 16A:
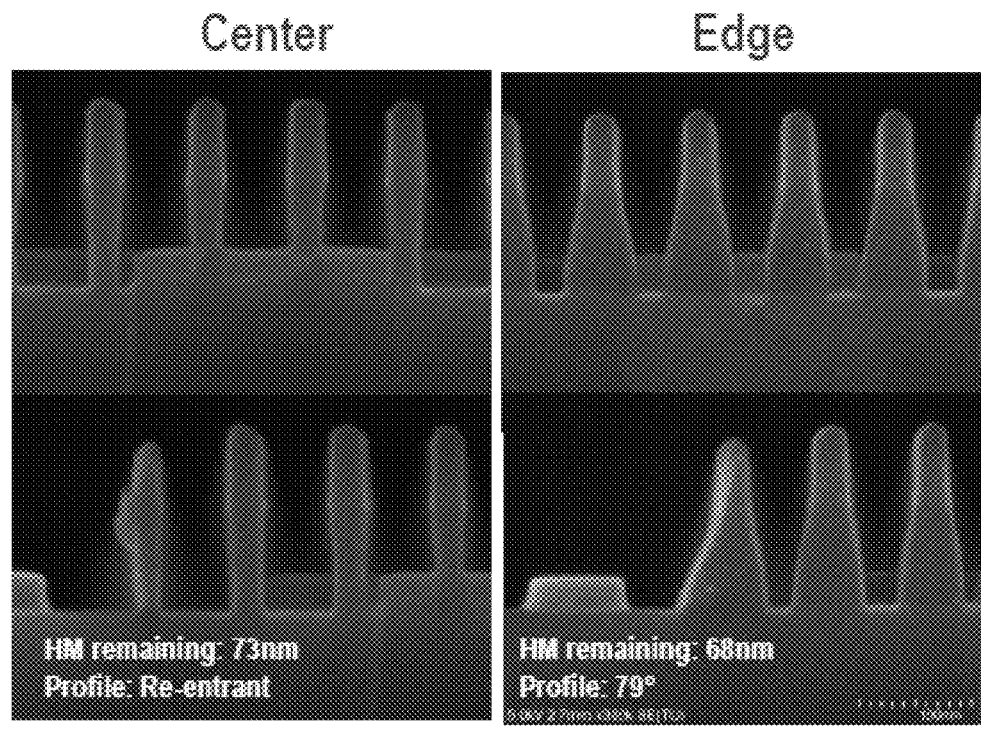
FIGS. 16A and 16B show SEM images of FinFET structures that have been etched according to a high pressure conventional technique (16A) and according to an embodiment using a plasma grid (16B).
Figure 16B:
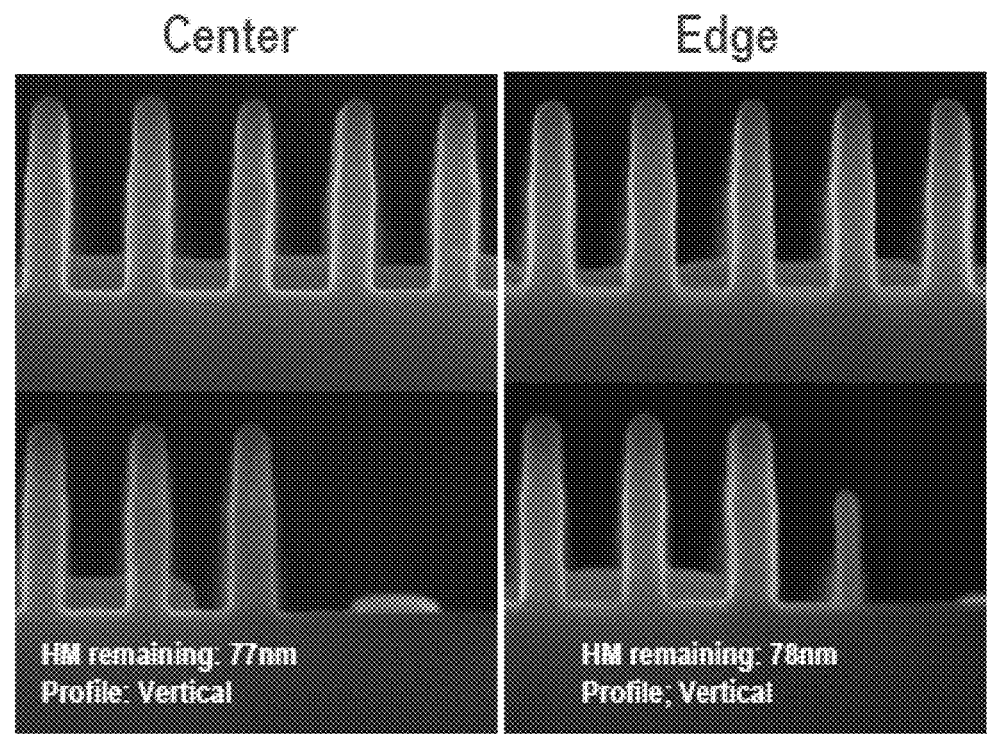

FIGS. 16A and 16B show scanning electron microscope (SEM) images of FinFET structures that have been etched according to a high pressure conventional technique (16A) and according to the present embodiments using a plasma grid (16B). As shown in FIG. 16A, the conventional technique results in significant non-uniformity between the center and edge of the wafer. The I/D loading was large, and there was poor selectivity between the materials. Conversely, as shown in FIG. 16B, the use of the plasma grid substantially increases the center to edge uniformity. Further, the I/D loading was much lower, and the selectivity was improved. This experiment was performed on a Si carrier wafer thinned to a thickness representative of the FinFET height and covered with 50% SiN coupons to simulate the etch of a full-patterned wafer. The FinFET structures was over-etched by 65% to minimize the taper in the profile.

Figure 17B:
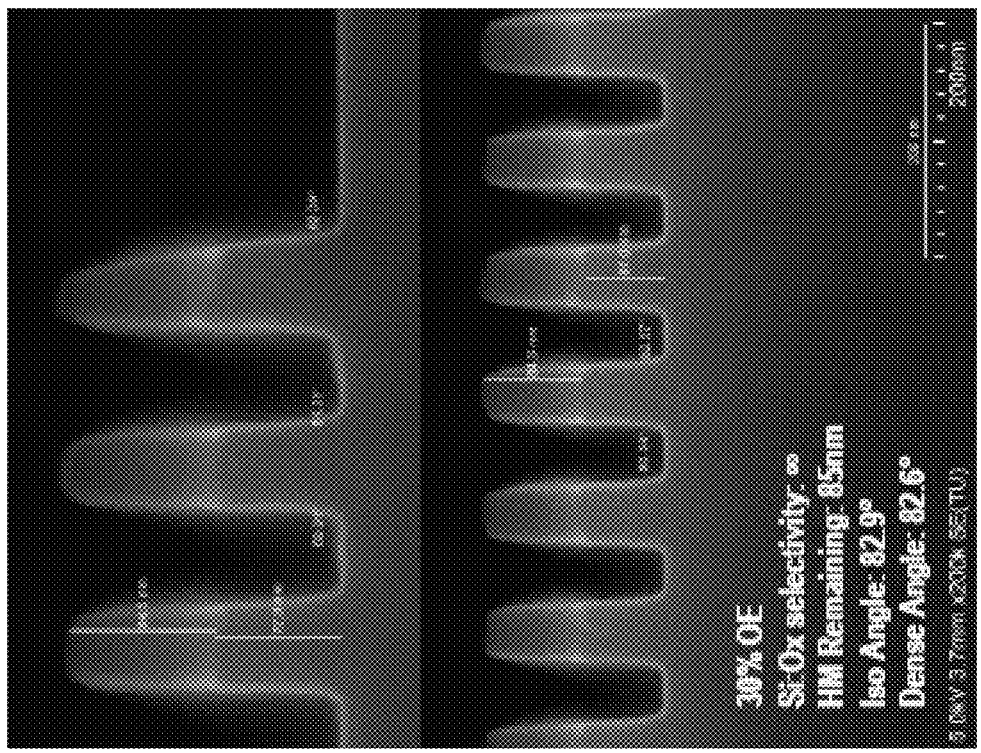
FIGS. 17A and 17B show SEM images of features etched according to a low pressure conventional technique (17A) and according to a presently disclosed embodiment using a plasma grid (17B).
Figure 17A:
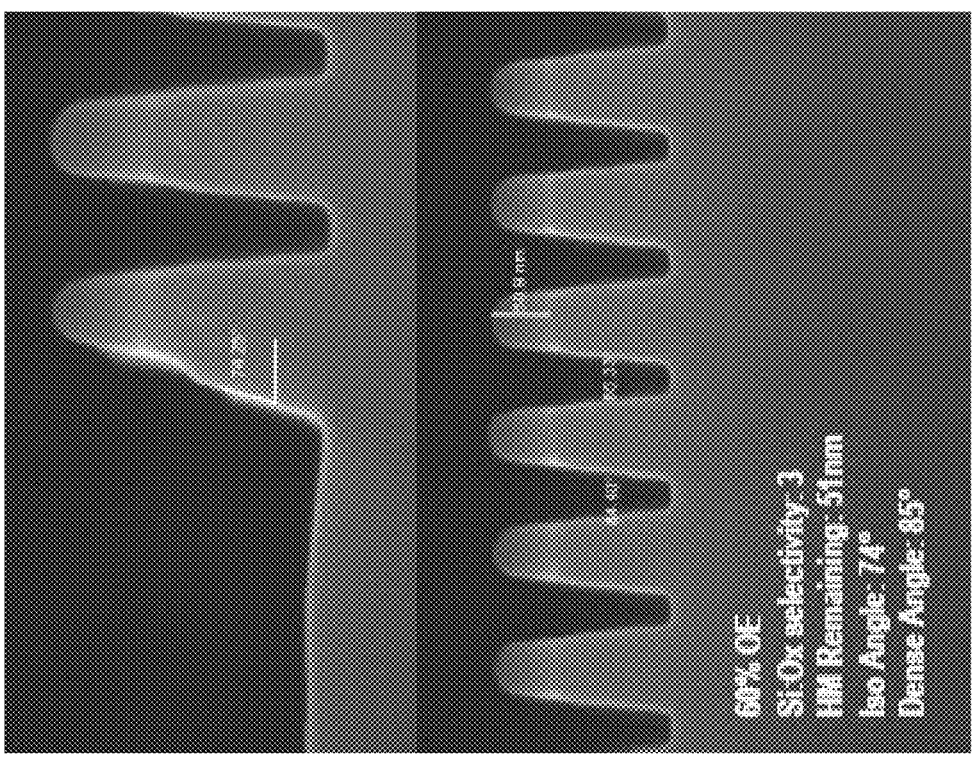

FIGS. 17A and 17B show SEM images of features etched according to a low pressure conventional technique (17A) and according to the present embodiments using a plasma grid (17B). The conventional technique showed relatively poor selectivity between the silicon and oxide, the etched features had a tapered profile, and the I/D loading was poor. As shown in FIG. 17B, however, the source grid provided improved selectivity (infinite selectivity), a more vertical profile angle, and virtually no I/D loading. This experiment was performed on a chip cleaved from a patterned wafer and placed on the center of a carrier wafer. This experiment was performed on a Si carrier wafer thinned to a thickness representative of the FinFET height and covered with 50% SiN coupons to simulate the etch of a full-patterned wafer.

Figure 18:
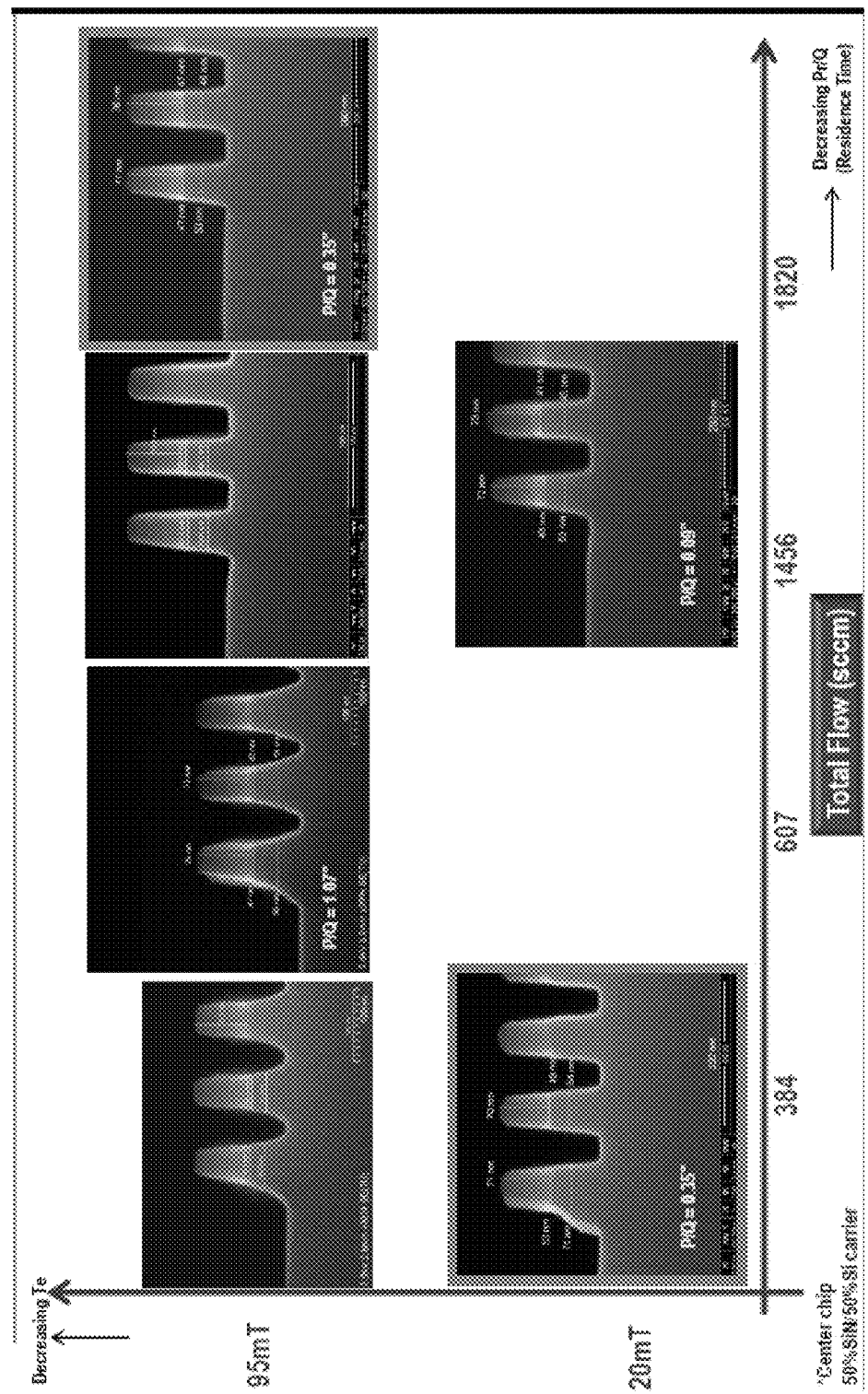
FIG. 18 shows various SEM images of features that have been etched according to various regimes without the use of a plasma grid.

FIG. 18 shows various SEM images of features that have been etched according to various regimes without the use of a plasma grid. Two different pressures were used, as well as four different total flow rates. The effective electron temperature (Te) decreases with increasing pressure. Residence time decreases with increasing total flow rate. For each pressure, increasing the total flow rate improves the etch results. In particular, the high flow cases show better (more vertical) profile angles and improved selectivity (more mask remaining) However, these improvements are mitigated by poorer I/D loading and center to edge uniformity. The results at high flow rates support the belief that certain byproducts and/or dissociation products, when not swept away in gaseous form, may be adhering to feature sidewalls and/or bottoms to produce poor etching results, as illustrated in FIGS. 6A-6C. When the total flow rate is higher, these byproducts are more effectively swept out of the reaction chamber and are less likely to cause etching defects.

Figure 19:
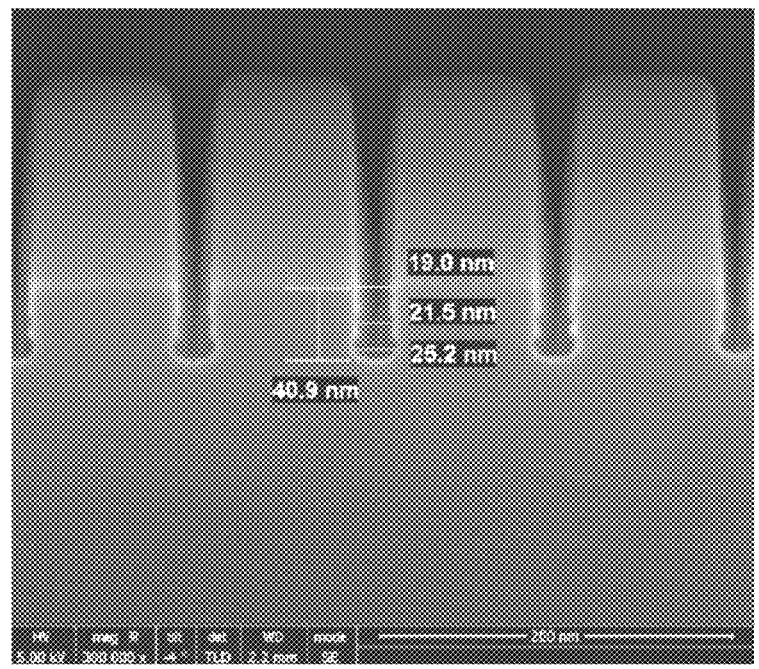
FIG. 19 illustrates different etching shapes achieved with conventional and ion-ion plasmas during a source-drain recess etch.
Figure 19:
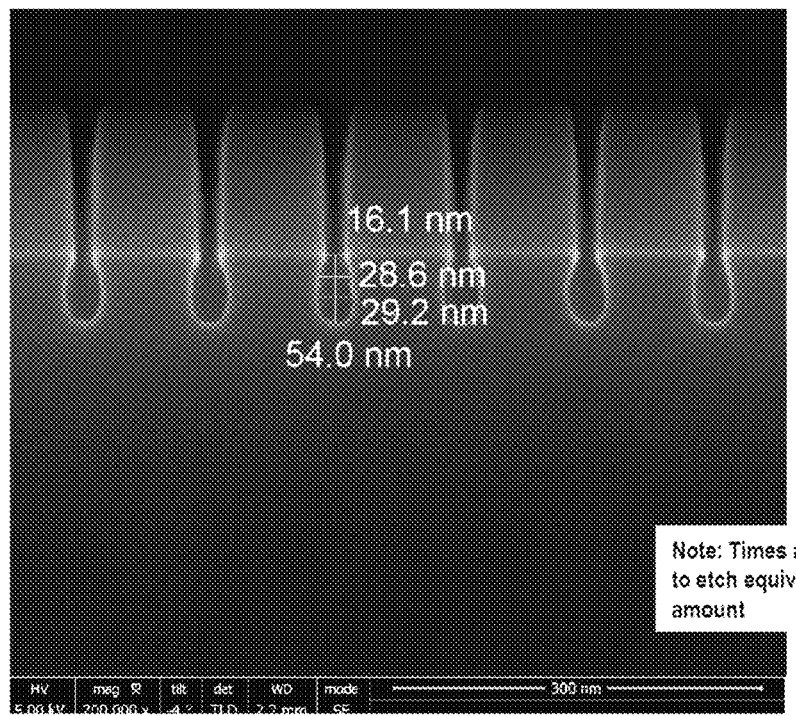

FIG. 19 presents SEMs of features etched through a source-drain recess etch process. As described above in relation to Example 1, the source-drain recess etch is a multi-step process involving (1) a vertical etch, (2) a lateral etch, and (3) an oxidation step. The upper panel shows a substrate that was processed using conventional plasma. In this case, the etching shape shows distinct scalloped edges. These scalloped edges arise due to the thick oxidation layer that prevents further lateral etching. In contrast, the lower panel shows a substrate that was processed using ion-ion plasma. Here, the etched region is much smoother, with substantially less distinct scalloping and more rounded/ smooth edges. The ion-ion plasma results in a more workable oxide layer that, while still protecting the sidewalls from over-etching, allows some amount of etching in order to smooth out the sidewalls and create desired shapes. The low electron density in the ion-ion plasma permits a relatively gentle oxidation of the silicon material. This results in minimal scalloping and enhanced profile control.

Figure 20:
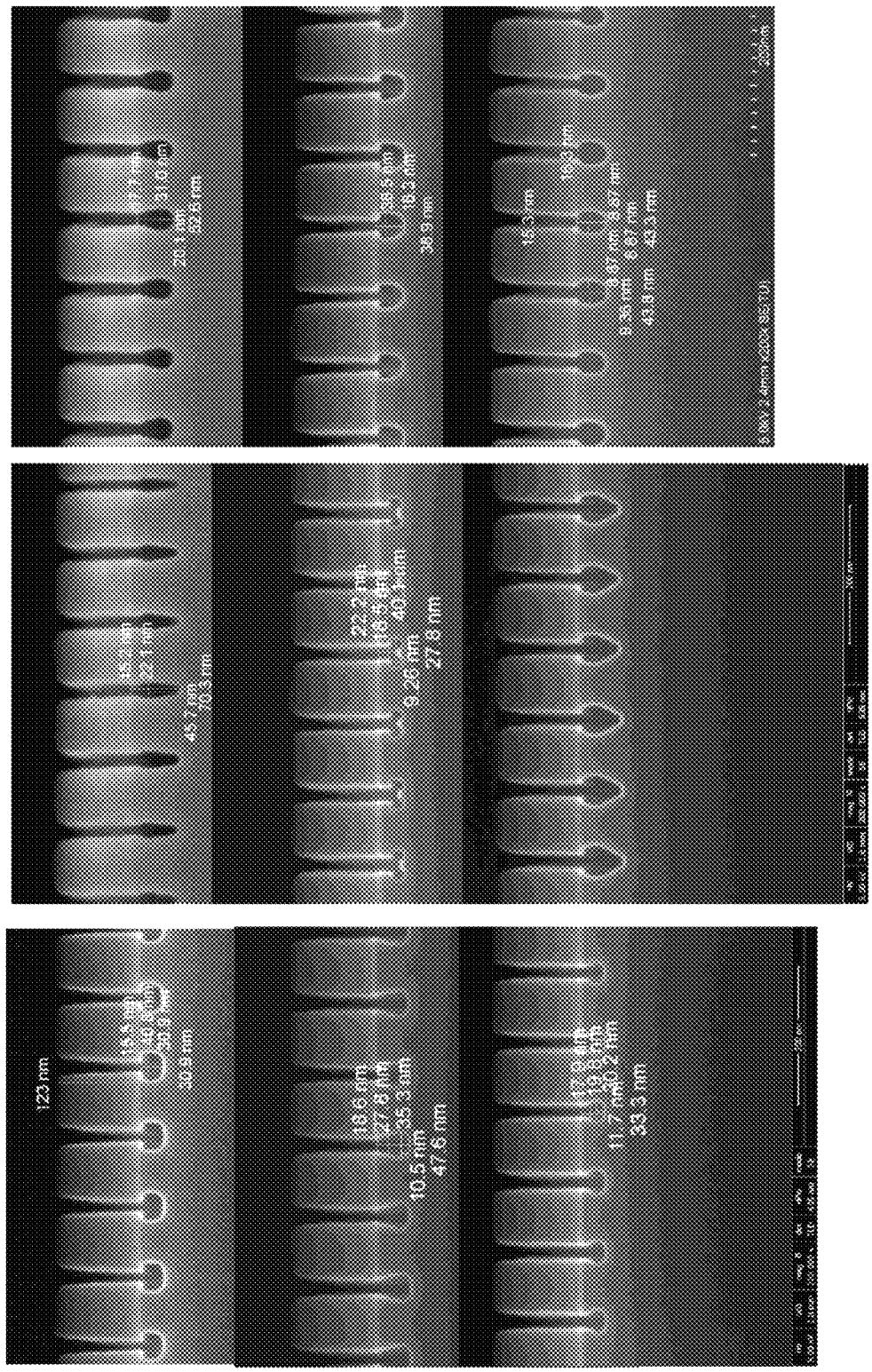
FIG. 20 shows various etching shapes achieved during a source-drain recess etch process.

FIG. 20 shows various SEMs of features etched in an ion-ion plasma through a source-drain recess etch process. As shown, many different feature shapes may be achieved where an ion-ion plasma is used. This opens up the possibility for many new and different source-drain recess shapes.

Figure 21:
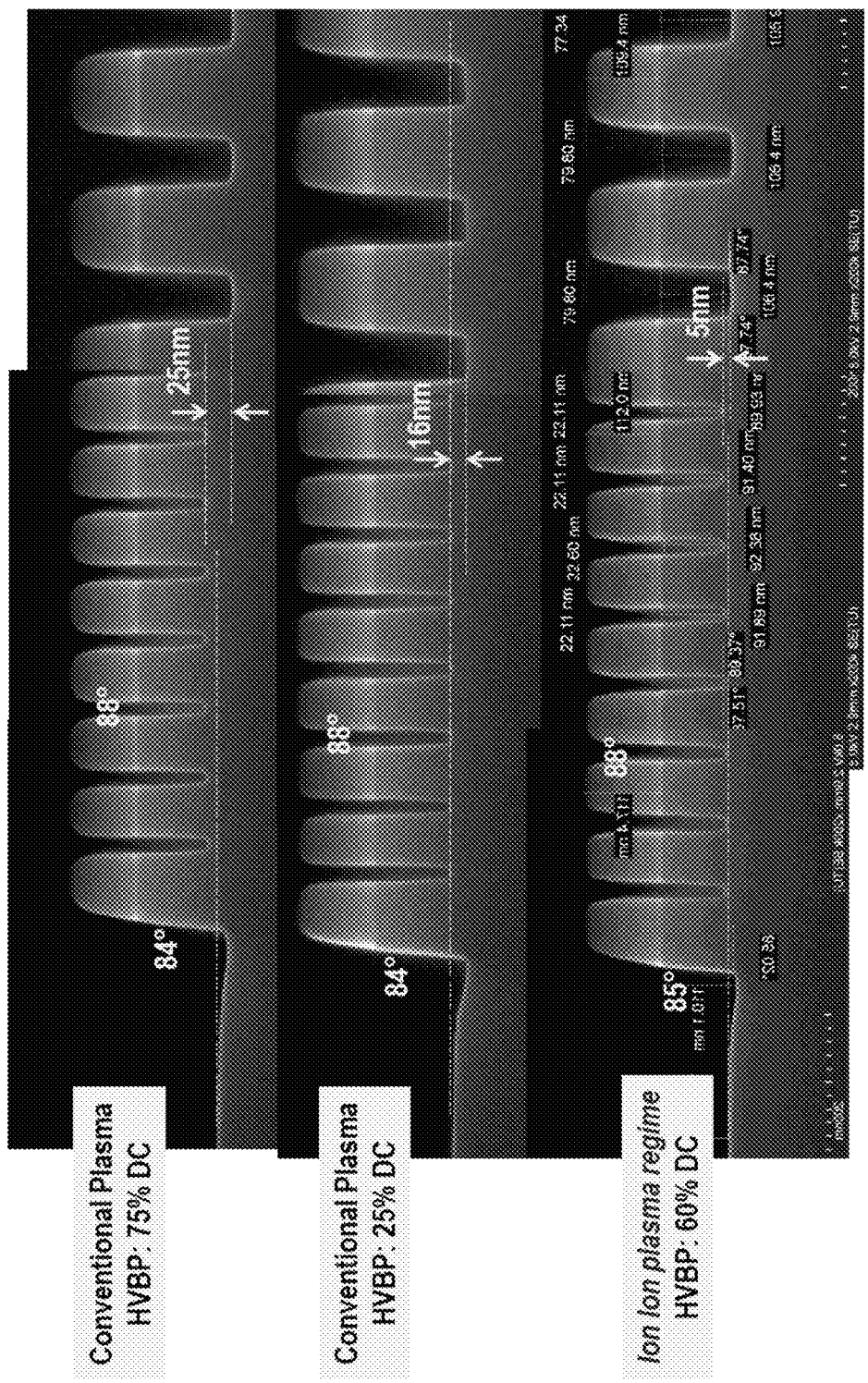
FIG. 21 illustrates etching profiles and loading effects for shallow trench isolation processes run in conventional and ion-ion plasma regimes.

FIG. 21 presents SEMs of features formed under a shallow trench isolation etch process using different plasma regimes. The upper and middle portions of the figure relate to a substrate that was processed under a conventional plasma. The upper substrate had a substrate bias pulsing of about 75% DC, while the middle substrate had an substrate bias pulsing of about 25% DC. The lower portion of the figure relates to a substrate that was processed under an ion-ion plasma regime, with a substrate bias pulsing of about 60% DC. All of the substrates showed good vertical profiles for the high aspect ratio features. The substrate processed in the ion-ion plasma showed an improved etching profile in the low aspect ratio features (85° versus the 84° seen for the conventional plasma). Further, the substrate processed in the ion-ion plasma regime showed much better etch depth loading. While the conventional plasma resulted in etch depth loading of about 25 nm and 16 nm, the ion-ion plasma resulted in etch depth loading of only about 5 nm. The total etch depth was about 230 nm.

Various experiments showed that the use of the plasma grid resulted in an etching process with very good selectivity, profile angle, I/D loading, and center to edge uniformity. In certain cases, the selectivity (i.e., the etch rate of Si:etch rate of oxide) is greater than about 10, or greater than about 100. In fact, infinite selectivity may be achieved using the plasma grid in certain cases. In these cases, there is virtually no etching of the oxide material, and there may even be a small amount of deposition on the oxide surface. The profile angle achieved in many cases is substantially vertical (e.g., over about 89°). In certain implementations, the I/D loading was shown to be below about 2°. Further, the center to edge uniformity in various implementations was less than about 2 nm.

What is claimed is:

1. A method of reflowing photoresist, the method comprising:
   receiving a substrate in a reaction chamber, the substrate having photoresist patterned thereon, wherein the reaction chamber comprises a grid structure dividing the interior of the reaction chamber into an upper sub-chamber proximate a plasma generator and a lower sub-chamber proximate a substrate holder;
   flowing a first plasma generating gas into the upper sub-chamber;
   generating a first plasma in the upper sub-chamber from the first plasma generating gas, the first plasma having a first electron density, and generating a second plasma in the lower sub-chamber, wherein the second plasma is an ion-ion plasma that has a second electron density at least about 10 times lower than the first electron density;
   exposing the substrate to the second plasma to smooth the photoresist;
   flowing a second plasma generating gas into the upper sub-chamber;
   generating a third plasma in the upper sub-chamber from the second plasma generating gas, the third plasma having a third electron density, and generating a fourth plasma in the lower sub-chamber, wherein the fourth plasma is an ion-ion plasma that has a fourth electron density at least about 10 times lower than the third electron density; and
   exposing the substrate to the fourth plasma,
   wherein before exposing the substrate to the second plasma the photoresist has an initial line width roughness, wherein after exposing the substrate to the fourth plasma the photoresist has a final line width roughness, and wherein the final line width roughness is about 75% or less of the initial line width roughness.

2. The method of claim 1,
   wherein exposing the substrate to the fourth plasma removes photoresist in a foot region of the photoresist.

3. The method of claim 1, wherein the first plasma generating gas comprises at least one gas selected from the group consisting of: $H_2$, Ar, HBr, and combinations thereof.

4. The method of claim 3, wherein the first plasma generating gas further comprises $N_2$ and/or HeSTG.

5. The method of claim 3, wherein the first plasma generating gas comprises $H_2$.

6. The method of claim 1, wherein the second plasma generating gas comprises at least one gas selected from the group consisting of Ar, HBr, and a combination thereof.

7. The method of claim 6, wherein the second plasma generating gas comprises Ar.

8. The method of claim 7, wherein the first plasma generating gas comprises $H_2$.

9. The method of claim 1, wherein exposing the substrate to the second plasma both (i) smooths the photoresist, and (ii) removes the photoresist in a foot region of the photoresist.

10. The method of claim 9, wherein the first plasma generating gas comprises $H_2$, $N_2$, and HeSTG.

11. The method of claim 1, wherein the photoresist comprises extreme ultraviolet photoresist.

12. The method of claim 1, further comprising applying a bias voltage to the substrate while the substrate is exposed to the fourth plasma, wherein the bias voltage is about 200V or less.

13. The method of claim 12, wherein the bias voltage is greater than about 30V.

14. The method of claim 1, wherein before exposing the substrate to the second plasma the photoresist has an initial height, wherein after exposing the substrate to the fourth plasma the photoresist has a final height, and wherein the final height is at least about 50% of the initial height.

15. The method of claim 1, wherein the final line width roughness is about 65% or less of the initial line width roughness.

16. The method of claim 1, wherein the first plasma has a first electron temperature of about 2 eV or more, and wherein the second plasma has a second effective electron temperature of about 1 eV or less.

17. The method of claim 1, wherein the second electron density is about $5 \times 10^9$ cm$^{-3}$ or less.

18. The method of claim 1, wherein a ratio of negative ions:positive ions in the second plasma is between about 0.5-1.

19. The method of claim 1, wherein the first plasma is an inductively coupled plasma generated at a power between about 300-1000 Watts per substrate.

20. The method of claim 19, wherein a bias applied to the substrate is between about 50-200 V.

21. The method of claim 1, wherein after smoothing the photoresist, the substrate has a line width roughness of about 3.0 nm or below.

22. The method of claim 1,
   wherein the first plasma generating gas and the second plasma generating gas have different compositions.

23. The method of claim 22, wherein the first plasma generating gas comprises $H_2$, and wherein the second plasma generating gas does not comprise $H_2$.

* * * * *